(12) United States Patent
Ahn et al.

(10) Patent No.: US 12,412,633 B2
(45) Date of Patent: Sep. 9, 2025

(54) FLASH MEMORY FOR REDUCING RELIABILITY DEGRADATION OF OS DATA DUE TO SMT PROCESS

(71) Applicant: Samsung Electronics Co., Ltd., Suwon-si (KR)

(72) Inventors: Hyojin Ahn, Suwon-si (KR); Seongkuk Kim, Suwon-si (KR); Dongwoo Shin, Suwon-si (KR); Seoyeong Lee, Suwon-si (KR); Changjun Lee, Suwon-si (KR); Hoon Jo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 168 days.

(21) Appl. No.: 18/209,069

(22) Filed: Jun. 13, 2023

(65) Prior Publication Data
US 2024/0153567 A1    May 9, 2024

(30) Foreign Application Priority Data

Nov. 7, 2022  (KR) ......................... 10-2022-0147070

(51) Int. Cl.
*G11C 13/00*    (2006.01)
*G11C 11/56*    (2006.01)
(Continued)

(52) U.S. Cl.
CPC ...... *G11C 16/3409* (2013.01); *G11C 11/5628* (2013.01); *G11C 11/5635* (2013.01);
(Continued)

(58) Field of Classification Search
CPC . G11C 11/5628; G11C 16/10; G11C 16/0483; G11C 16/3459; G11C 2211/5621; G11C 16/3418; G11C 16/26; G11C 16/3404; G11C 16/08; G11C 16/12; G11C 11/5642; G11C 16/3454; G11C 16/349;
(Continued)

(56) References Cited

U.S. PATENT DOCUMENTS

| 5,953,255 A | 9/1999 | Lee |
| 7,907,444 B2 | 3/2011 | Sarin et al. |

(Continued)

FOREIGN PATENT DOCUMENTS

| KR | 10-1100547 B1 | 12/2011 |
| KR | 10-2039537 B1 | 11/2019 |

(Continued)

*Primary Examiner* — Thong Q Le

(57) ABSTRACT

The present disclosure provides apparatuses and methods for operating a flash memory for programming operating system (OS) data before an surface mount technology (SMT) process. In some embodiments, the method includes erasing a plurality of memory cells in a memory block, reducing a lateral charge loss of the plurality of memory cells due to high temperature degradation during the SMT process by applying a pre-program voltage to word lines coupled to the memory block, and performing multi-bit programming of the OS data in the plurality of memory cells, prior to performing the SMT process. The applying of the pre-program voltage causes threshold voltages of the plurality of memory cells to increase.

20 Claims, 18 Drawing Sheets

(51) Int. Cl.
*G11C 16/04* (2006.01)
*G11C 16/10* (2006.01)
*G11C 16/16* (2006.01)
*G11C 16/34* (2006.01)

(52) U.S. Cl.
CPC ...... *G11C 11/5671* (2013.01); *G11C 16/0483* (2013.01); *G11C 16/10* (2013.01); *G11C 16/16* (2013.01)

(58) Field of Classification Search
CPC ............ G11C 16/30; G11C 2211/5641; G11C 7/1006; G11C 7/1045; G11C 16/20; G11C 5/147; G11C 11/5635; G11C 11/5671; G11C 16/0408; G11C 16/14; G11C 16/24; G11C 16/32; G11C 16/3431; G11C 16/344; G11C 8/10; G11C 11/4093; G11C 11/5621; G11C 16/102; G11C 16/3427; G11C 16/3481; G11C 16/3486; G11C 2029/0409; G11C 2029/0411; G11C 2207/2236; G11C 2211/5622; G11C 2211/5624; G11C 29/021; G11C 29/028; G11C 29/42; G11C 7/02; G11C 16/34; H10B 41/27; H10B 43/27

See application file for complete search history.

(56) References Cited

U.S. PATENT DOCUMENTS

| | | |
|---|---|---|
| 8,938,581 B2 | 1/2015 | Cho et al. |
| 9,424,933 B2 | 8/2016 | Choi et al. |
| 9,483,397 B2 | 11/2016 | Wakchaure et al. |
| 9,646,704 B2 | 5/2017 | Moon et al. |
| 9,671,969 B2 | 6/2017 | Shim et al. |
| 9,734,898 B2 | 8/2017 | Seol et al. |
| 9,812,214 B2 | 11/2017 | Shim et al. |
| 9,864,544 B2 | 1/2018 | Oh et al. |
| 10,340,947 B2 | 7/2019 | Oh et al. |
| 10,691,346 B2 | 6/2020 | Han |
| 10,706,938 B2 | 7/2020 | Cha et al. |
| 10,790,035 B2 | 9/2020 | Choi et al. |
| 11,004,517 B2 | 5/2021 | Lee et al. |
| 11,322,208 B2 | 5/2022 | Seo et al. |
| 2006/0098492 A1 | 5/2006 | Lee |
| 2010/0124121 A1 | 5/2010 | Seo |
| 2021/0375364 A1 | 12/2021 | Liikanen et al. |
| 2022/0148664 A1 | 5/2022 | Cho |
| 2023/0251781 A1* | 8/2023 | Son .................. G11C 16/26 711/103 |

FOREIGN PATENT DOCUMENTS

| | | |
|---|---|---|
| KR | 10-2147916 B1 | 8/2020 |
| KR | 10-2021-0003633 A | 1/2021 |
| KR | 10-2309841 B1 | 10/2021 |

* cited by examiner

FIG.11
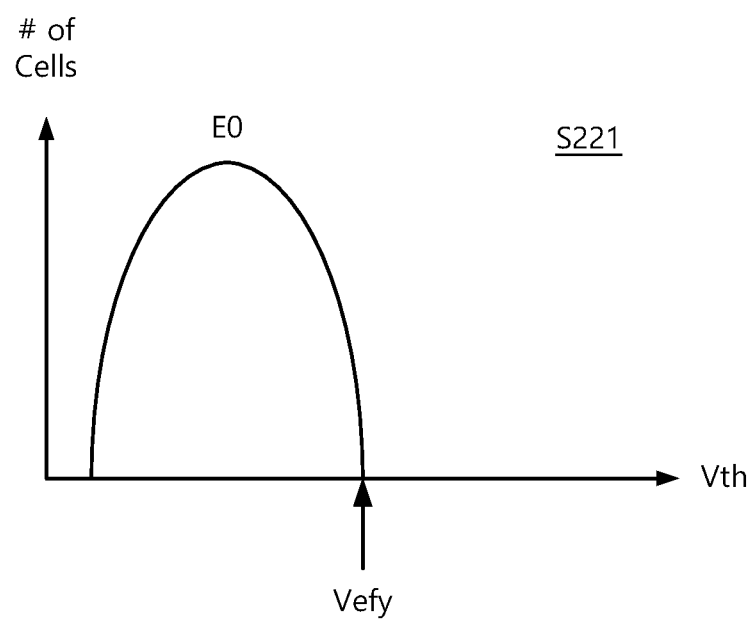
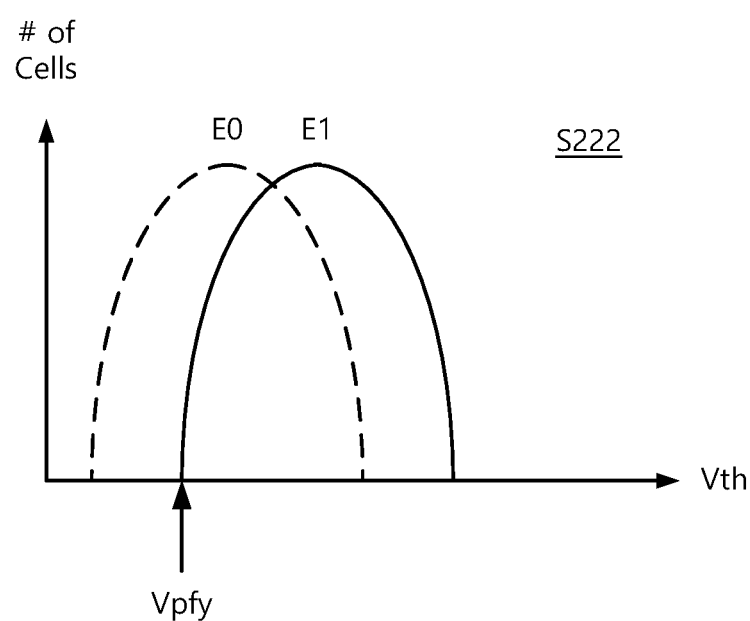

FLASH MEMORY FOR REDUCING RELIABILITY DEGRADATION OF OS DATA DUE TO SMT PROCESS

CROSS-REFERENCE TO RELATED APPLICATIONS

This application claims benefit of priority under 35 U.S.C. § 119 to Korean Patent Application No. 10-2022-0147070, filed on Nov. 7, 2022, in the Korean Intellectual Property Office, the disclosure of which is incorporated by reference herein in its entirety.

BACKGROUND

1. Field

The present disclosure relates generally to a semiconductor memory device, and more particularly, to a flash memory that reduces reliability degradation of operating system (OS) data due to a surface mount technology (SMT) process.

2. Description of Related Art

A semiconductor memory may be classified as a volatile memory or a non-volatile memory. The volatile memory (e.g., a dynamic random access memory (DRAM) or a static random access memory (SRAM)) may exhibit faster read and/or write speed when compared to the non-volatile memory. However, data stored in the volatile memory may disappear when a power applied to the volatile memory is turned off. In contrast, the non-volatile memory may retain the data even when the power is turned off.

A representative example of the non-volatile memory may be a flash memory. The flash memory may store multi-bit data of two or more bits in one memory cell. The flash memory may have at least one erase state and a plurality of program (e.g., writing) states depending on threshold voltage distributions.

The flash memory may be used as a storage device for electronic devices such as, but not limited to, computers, smart phones, digital cameras and the like. For example, the storage device may be configured to store operating system (OS) data from among other types of data. The OS data may be stored in the storage device before the storage device is mounted on a printed circuit board.

Surface mount technology (SMT) and/or infrared reflow (IR Reflow) may be used to mount the storage device onto the printed circuit board. However, reliability of the OS data stored in the flash memory may be deteriorated by the mounting process. For example, a threshold voltage distribution of memory cells of the flash memory may change due to a high-temperature SMT process and, as a result, reliability of the OS data stored in the flash memory may deteriorate.

Thus, there exists a need for further improvements in storage device technology, as the need for reliable OS data may be constrained by the storage device manufacturing process. Improvements are presented herein. These improvements may also be applicable to other memory storage technologies and the standards that employ these technologies.

SUMMARY

Aspects of the present disclosure provide a flash memory that may reduce the probability of generating error bits due to high-temperature deterioration in the surface mount technology (SMT) process.

Aspects of the present disclosure provide a flash memory that may reduce a reliability degradation of operating system (OS) data due to an SMT process.

According to an aspect of the present disclosure, a method of operating a flash memory is provided. The method includes erasing a plurality of memory cells in a memory block, reducing a lateral charge loss of the plurality of memory cells due to high temperature degradation during a SMT process by applying a pre-program voltage to word lines coupled to the memory block, and performing multi-bit programming of OS data in the plurality of memory cells, prior to performing the SMT process. The applying of the pre-program voltage causes threshold voltages of the plurality of memory cells to increase.

According to an aspect of the present disclosure, a method of operating a flash memory is provided. The method includes erasing a plurality of memory cells in a memory block, multi-bit programming OS data to the plurality of memory cells, and reducing a lateral charge loss of the plurality of memory cells due to high temperature degradation during a SMT process by increasing threshold voltages of the plurality of memory cells in an erased state by using soft stress.

According to an aspect of the present disclosure, a method of operating a storage device is provided. The method includes erasing memory cells in a memory block of the storage device, multi-bit programming OS data to the erased memory cells, and reducing a lateral charge loss of the multi-bit programmed memory cells due to high temperature degradation during a SMT process by shaping, using a state shaping encoder, program states of the multi-bit programmed memory cells.

Additional aspects will be set forth in part in the description which follows and, in part, will be apparent from the description, or may be learned by practice of the presented embodiments.

BRIEF DESCRIPTION OF DRAWINGS

The above and other aspects, features, and advantages of certain embodiments of the present disclosure will be more apparent from the following description taken in conjunction with the accompanying drawings, in which:

FIG. 11 is a graph illustrating distribution of threshold voltages of memory cells, according to an embodiment;

DETAILED DESCRIPTION

Figure 1:
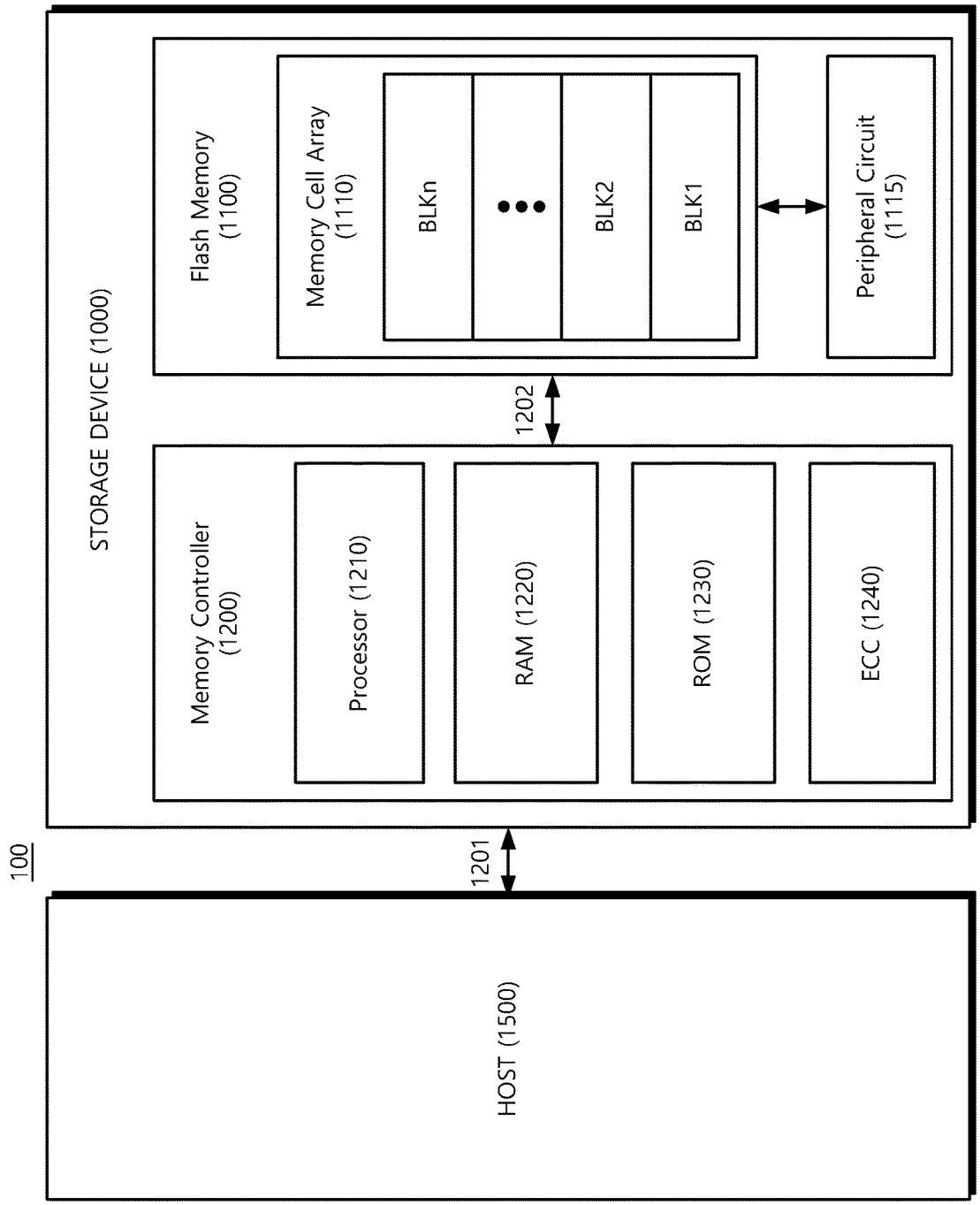
FIG. 1 is a block diagram illustrating a memory system, according to an embodiment.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", etc. may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", etc. may be used to distinguish components from each other and do not limit the present disclosure. For example, the terms "first", "second", "third", etc. may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

Hereinafter, various embodiments of the present disclosure are described with reference to the accompanying drawings.

FIG. 1 is a block diagram illustrating a memory system, according to an embodiment of the present disclosure. Referring to FIG. 1, a memory system 100 includes a storage device 1000 and a host 1500. The storage device 1000 may be connected to the host 1500 through a host interface 1201.

The storage device 1000 may be based on non-volatile memory. For example, the storage device 1000 may include a flash storage device based on the flash memory 1100. The flash storage device may be implemented as an solid-state drive (SSD), universal flash storage (UFS), a memory card, or the like. The storage device 1000 may include a flash memory 1100 and a memory controller 1200.

The flash memory 1100 may be connected to the memory controller 1200 through a flash interface 1202. The flash memory 1100 may include a memory cell array 1110 and a peripheral circuit 1115. The memory cell array 1110 may include a plurality of memory blocks BLK1 to BLKn (hereinafter, "BLK" generally), where n is a positive integer greater than zero (0). Each memory block BLK may have a vertical three-dimensional (3D) structure. Each memory block BLK may include a plurality of memory cells. Each memory cell of each memory block BLK may store multi-bit data (e.g., two or more bits).

The memory cell array 1110 may be located (e.g., disposed) next to or above the peripheral circuit 1115 in terms of the design layout structure. A structure in which the memory cell array 1110 is positioned over the peripheral circuit 1115 may be referred to as a cell on peripheral (COP) structure. In an embodiment, the memory cell array 1110 and the peripheral circuit 1115 may be manufactured as separate chips. Alternatively or additionally, an upper chip including the memory cell array 1110 and a lower chip including the peripheral circuit 1115 may be connected to each other by a bonding method. Such a structure may be referred to as a chip-to-chip (C2C) structure.

The peripheral circuit 1115 may receive external power from the memory controller 1200 and generate internal power of various levels. The peripheral circuit 1115 may receive commands, addresses, and/or data from the memory controller 1200 and store data in the memory cell array 1110 according to control signals and/or commands and addresses. Alternatively or additionally, the peripheral circuit 1115 may read data stored in the memory cell array 1110 and provide the read data to the memory controller 1200.

Continuing to refer to FIG. 1, the memory controller 1200 may include a processor 1210, a random access memory (RAM) 1220, a read-only memory (ROM) 1230, and an error correction code (ECC) circuit 1240.

In an embodiment, the processor 1210 may control overall operations of the memory controller 1200. Alternatively or additionally, the processor 1210 may receive a set feature command from the host 1500 and set an SMT operation mode. For example, the processor 1210 may perform a ROM burst operation before performing a SMT process. For another example, the processor 1210 may perform a ROM burst migration operation after performing the SMT process, according to the SMT operation mode.

The RAM 1220 may include a cache memory (e.g., static RAM (SRAM)), a buffer memory (e.g., dynamic RAM (DRAM)), and/or a driving memory. The RAM 1220 may drive software and/or firmware for performing the SMT operation mode under the control of the processor 1210.

The ROM 1230 may store various information required for the processor 1210 to operate. A portion of the various information stored in the ROM 1230 may be in the form of firmware. For example, the ROM 1230 may store SMT operation mode information. Alternatively or additionally, the ROM 1230 may store bit values for performing the ROM burst mode and/or the ROM burst migration mode (not shown). The ROM burst mode may refer to an operation mode for downloading operating system (OS) data before performing the SMT process. The ROM burst migration mode may refer to an operation mode for data migration after the SMT process has been performed.

The ECC circuit 1240 may generate an error correction code for correcting a fail bit and/or an error bit of data received from the flash memory 1100. The ECC circuit 1240 may generate data to which parity bits are added by performing error correction encoding on data provided to the flash memory 1100. In an embodiment, parity bits may be stored in the flash memory 1100.

The host 1500 may include a device for programming OS data in the storage device 1000. For example, the host 1500 may provide OS data to the storage device 1000 before performing the SMT process. The host 1500 may set the storage device 1000 to recognize OS data and operate according to the SMT operation mode.

Figure 2:
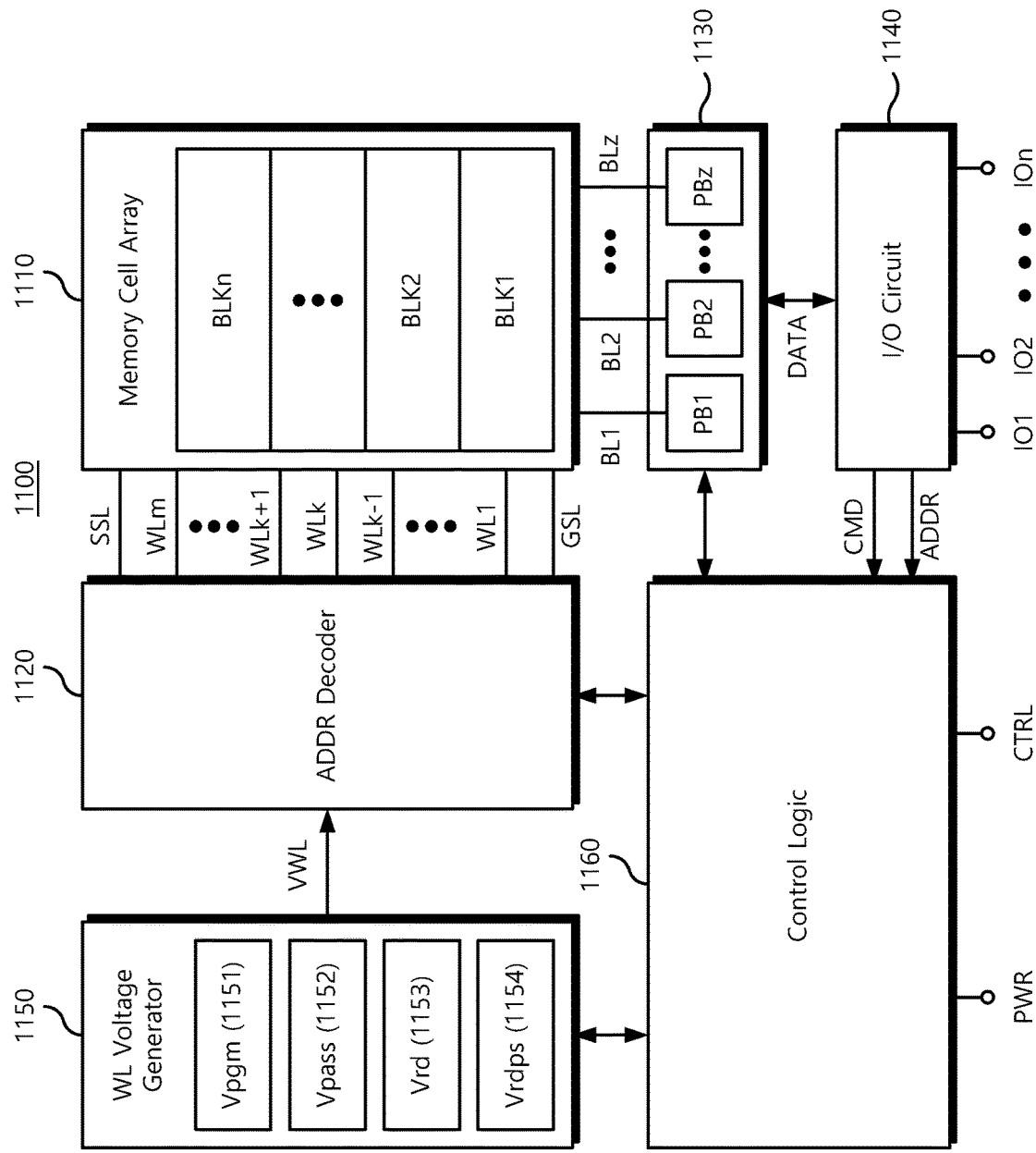
FIG. 2 is a block diagram illustrating an example of the flash memory of FIG. 1, according to an embodiment.

FIG. 2 is a block diagram illustrating an example of the flash memory of FIG. 1, according to an embodiment. Referring to FIG. 2, a flash memory 1110 includes a memory cell array 1110, an address decoder 1120, a page buffer circuit 1130, a data input/output circuit 1140, a word line voltage generator 1150, and a control logic 1160.

The memory cell array 1110 may include a plurality of memory blocks BLK. Each memory block may be composed of a plurality of pages. Each page may include a plurality of memory cells. Each memory cell may store multi-bit data (e.g., two or more bits). Each memory block may correspond to an erase unit, and each page may correspond to a read and/or write unit. That is, erase operations may be performed at the memory block level, and/or read/write operations may be performed at the page level.

In an embodiment, the memory cell array 1110 may be formed in a direction perpendicular to the substrate. Alternatively or additionally, a gate electrode layer and an insulation layer may be alternately deposited on the substrate. Each memory block (e.g., BLK1) may be connected (e.g., coupled) to a string selection line SSL, a plurality of word lines WL1 to WLm (hereinafter, "WL" generally, where m is a positive integer greater than zero (0)), and a ground selection line GSL.

The address decoder 1120 may be connected to the memory cell array 1110 through selection lines SSL and GSL and word lines WL. The address decoder 1120 may select a word line WL during a program and/or read operation. The address decoder 1120 may receive the word line voltage VWL from the word line voltage generator 1150 and provide a program voltage and/or a read voltage to the selected word line sWL.

The page buffer circuit 1130 may be connected to the memory cell array 1110 through bit lines BL1 to BLz (hereinafter, "BL" generally, where z is a positive integer greater than zero (0)). The page buffer circuit 1130 may temporarily store read data to be stored in the memory cell array 1110 and/or data read from the memory cell array 1110. The page buffer circuit 1130 may include page buffers PB1 to PBz (hereinafter, "PB" generally) connected to respective bit lines. Each page buffer PB may include a plurality of latches configured to store and/or read multi-bit data.

The input/output (I/O) circuit 1140 may be internally connected to the page buffer circuit 1130 through data lines and externally connected to a memory controller (e.g., memory controller 1200 of FIG. 1) through the input/output lines IO1 to IOn (hereinafter "IO", generally). The input/output circuit 1140 may receive program data from the memory controller 1200 during a program operation. Alternatively or additionally, the input/output circuit 1140 may provide data read from the memory cell array 1110 to the memory controller 1200 during a read operation.

The word line voltage generator 1150 may receive internal power from the control logic 1160 and generate a word line voltage VWL required to read and/or write data. The word line voltage VWL may be provided to a selected word line sWL or an unselected word line uWL through the address decoder 1120.

In an embodiment, the word line voltage generator 1150 may include a program voltage generator 1151 and a pass voltage generator 1152. The program voltage generator 1151 may generate a program voltage Vpgm that may be provided to the selected word line sWL during a program operation. The pass voltage generator 1152 may generate a pass voltage Vpass that may be provided to the selected word line sWL and the unselected word lines uWL.

Alternatively or additionally, the word line voltage generator 1150 may include a read voltage generator 1153 and a read pass voltage generator 1154. The read voltage generator 1153 may generate the select read voltage Vrd that may be provided to the select word line sWL during a read operation. The read pass voltage generator 1154 may generate a read pass voltage Vrdps that may be provided to the unselected word lines uWL. For example, the read pass voltage Vrdps may be a voltage sufficient to turn on memory cells connected to the unselected word lines uWL during a read operation.

The control logic 1160 may perform read, program, and/or erase operations of the flash memory 1100 using the command CMD, address ADDR, and control signal CTRL provided from the memory controller 1200. The address ADDR may include a block selection address for selecting one memory block. Alternatively or additionally, the address ADDR may include a row address for selecting one or more word lines WL and a column address for selecting one or more bit lines BL.

Figure 3:
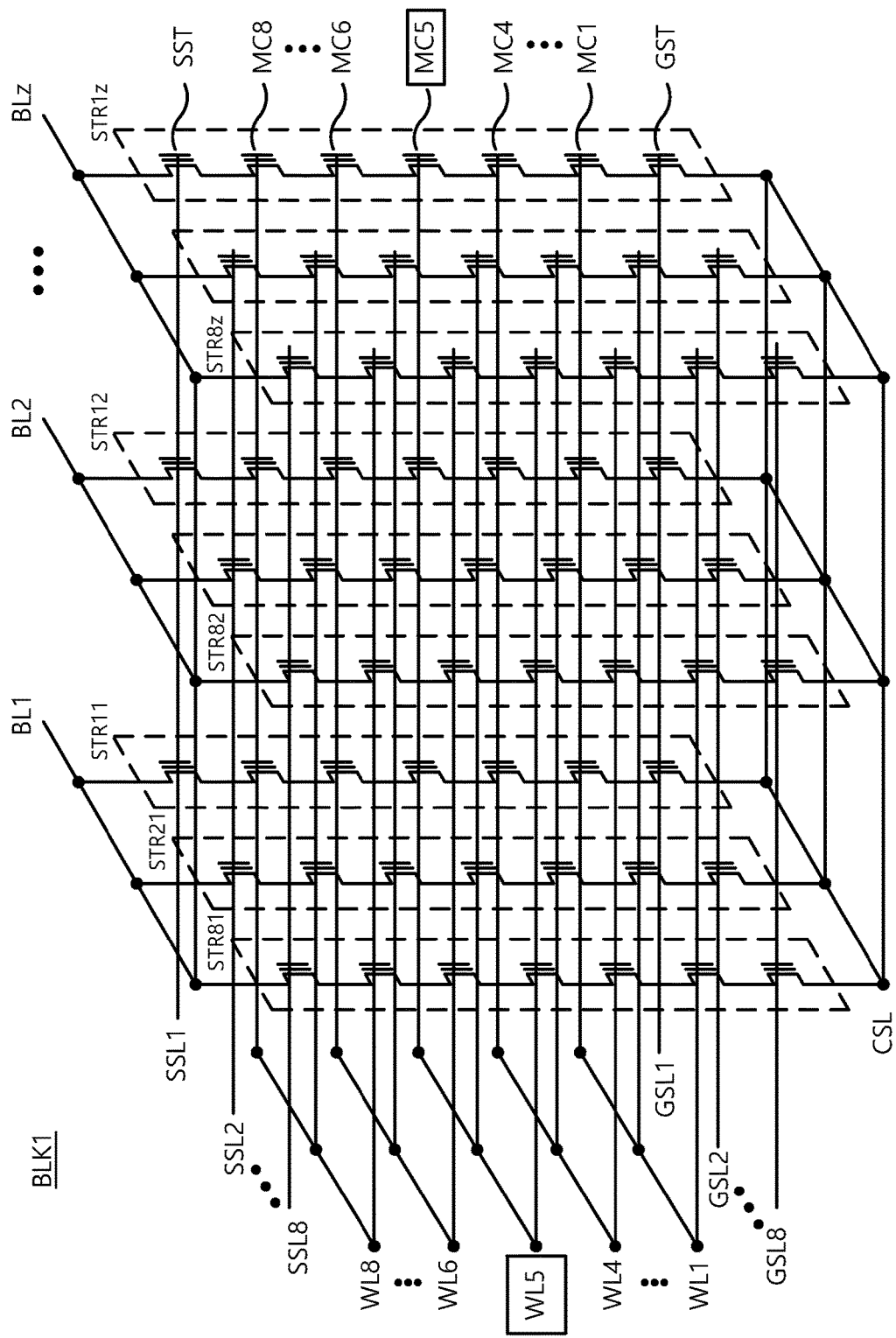
FIG. 3 is a circuit diagram illustrating an example of a memory block BLK1 of the memory cell array of FIG. 2, according to an embodiment.

FIG. 3 is a circuit diagram illustrating an example of a memory block BLK1 of the memory cell array 1110 of FIG. 2, according to an embodiment. Referring to FIG. 3, in the memory block BLK1, a plurality of cell strings STR11 to STR8z may be formed between the bit lines BL and a common source line CSL. Each cell string includes a string selection transistor SST, a plurality of memory cells MC1 to MC8, and a ground selection transistor GST.

The string selection transistors SST may be connected with string selection lines SSL1 to SSL8. The ground selection transistors GST may be connected with ground selection lines GSL1 to GSL8. The string selection transistors SST may be connected with the bit lines BL, and the ground selection transistors GST may be connected with the common source line CSL.

The first to eighth word lines WL1 to WL8 may be connected with the plurality of memory cells MC1 to MC8 in a row direction. The first to z-th bit lines BL may be connected with the plurality of memory cells MC1 to MC8 in a column direction. First to z-th page buffers PB may be connected with the first to z-th bit lines BL.

The first word line WL1 may be placed (e.g., disposed) above the first to eighth ground selection lines GSL1 to GSL8. The first memory cells MC1, which may be placed at substantially the same height from the substrate as the first word line WL1 may be connected with the first word line WL1. In a similar manner, the second to eighth memory cells MC2 to MC8, which may be placed at substantially the same heights from the substrate, may be respectively connected with the second to eighth word lines WL2 to WL8.

Figure 4:
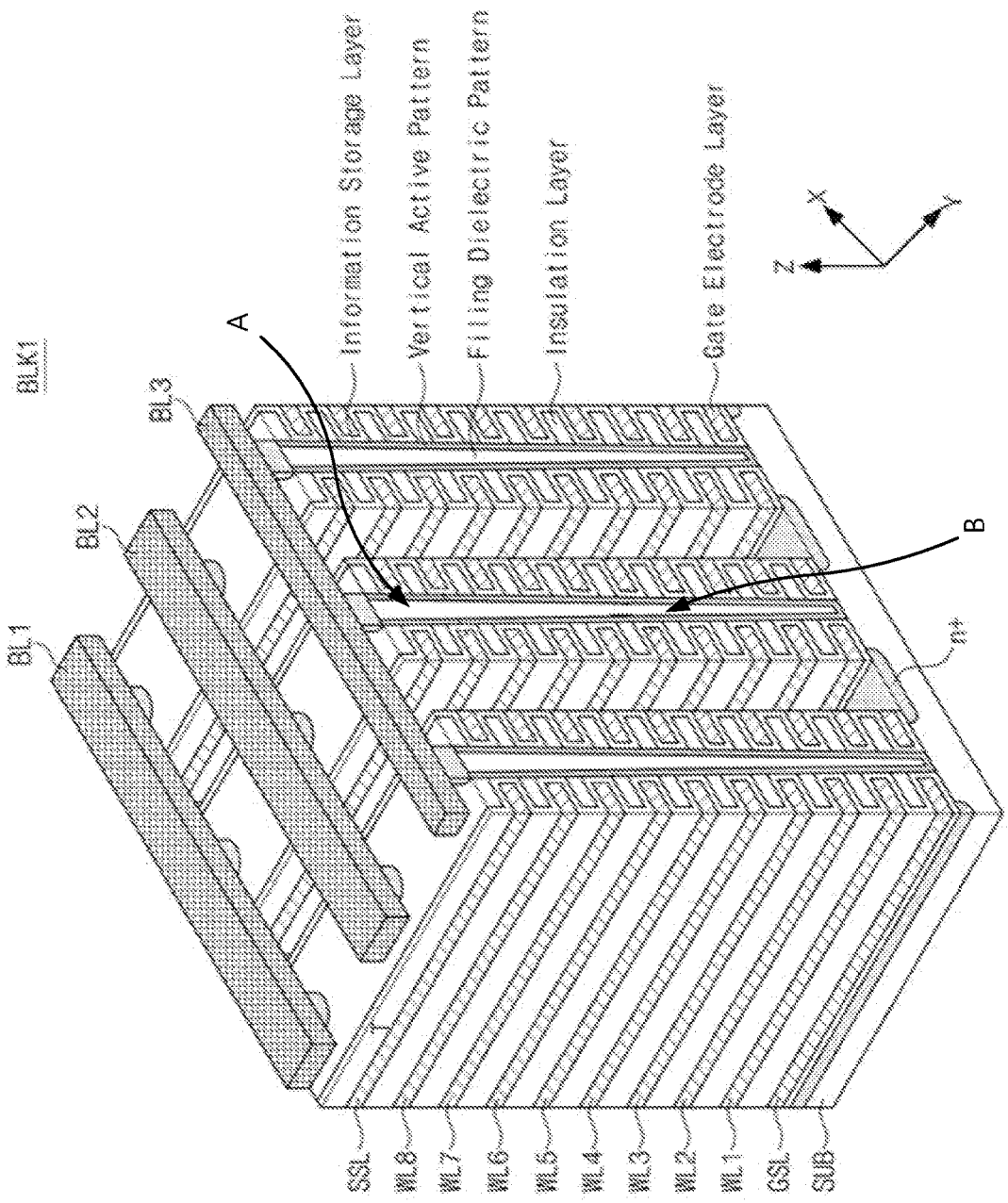
FIG. 4 is a perspective view illustrating a three-dimensional (3D) structure of a memory block BLK1 of the memory cell array of FIG. 2, according to an embodiment.

FIG. 4 is a perspective view illustrating a 3D structure of a memory block BLK1 of the memory cell array 1110 of FIG. 2, according to an embodiment. FIG. 4 shows a cross section cut in the Z direction in BL3. Referring to FIG. 4, the memory block BLK1 may be formed in a direction perpendicular to the substrate SUB. An n+ doped region may be formed on the substrate SUB.

A gate electrode layer and an insulation layer may be alternately deposited on the substrate SUB. An information storage layer may be formed between the gate electrode layer and the insulation layer.

When the gate electrode film and the insulating film are patterned in a vertical direction, a V-shaped pillar may be formed. The pillar may be connected to the substrate SUB by penetrating the gate electrode film and the insulating film. The inside of the pillar may be made of an insulating material such as, but not limited to, silicon oxide, as a filling dielectric pattern. The outside of the pillar may be composed of a channel semiconductor with a vertical active pattern.

A gate electrode layer of the memory block BLK1 may be connected to a ground selection line GSL, a plurality of word lines WL1 to WL8, and a string selection line SSL. Alternatively or additionally, a pillar of the memory block BLK1 may be connected to a plurality of bit lines BL1 to BL3. As shown in FIG. 4, one memory block BLK1 may have two select lines GSL and SSL, eight word lines WL1 to WL8, and three bit lines BL1 to BL3. However, the present disclosure is not limited in this regard. For example, a memory block, according to the present disclosure, may more or fewer select lines, word lines, and/or bit lines.

Figure 5:
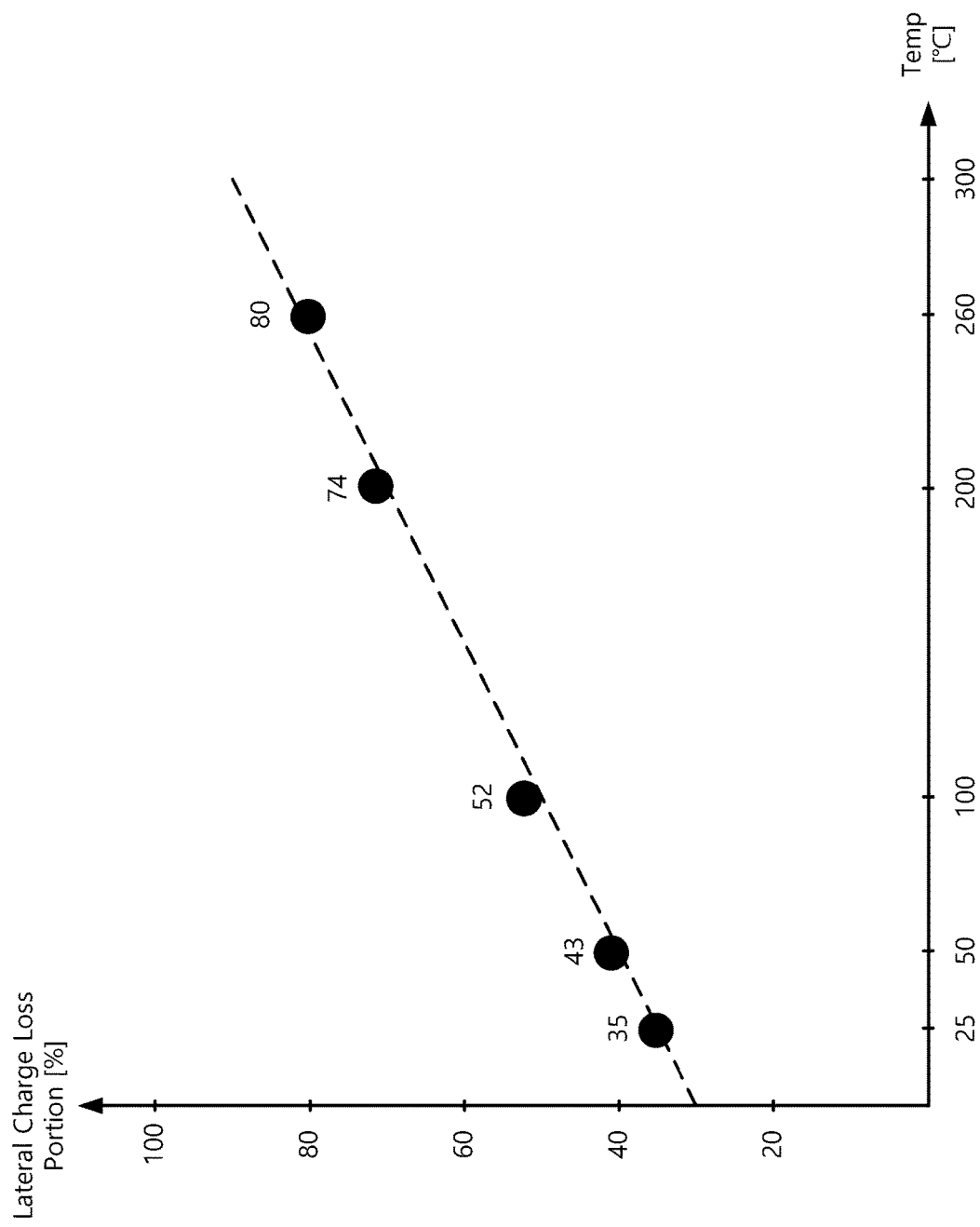
FIG. 5 is a graph illustrating experimental results of a lateral charge loss portion according to temperature in the memory block of FIG. 4, according to an embodiment.

FIG. 5 is a graph illustrating experimental results of a lateral charge loss portion according to temperature in the memory block BLK1 of FIG. 4, according to an embodiment. In FIG. 5, the horizontal axis represents temperature values in Celsius (° C.), and the vertical axis represents lateral charge loss portion values as a percentage (%).

The lateral charge loss may refer to a phenomenon in which charges trapped in the information storage layer of FIG. 4 escape in a lateral direction (e.g., Z direction). That is, the lateral charge loss may refer to a phenomenon in which charges trapped in the information storage layers A and/or B, as shown in FIG. 4, leak in the lateral direction (e.g., Z direction).

In an embodiment, the lateral charge loss may increase with increasing temperature. Referring to FIG. 5, when the temperature is approximately 25° C., the lateral charge loss portion may be approximately 35%, for example. It may be seen that when the temperature rises to 50° C., 100° C., and 200° C., the lateral charge loss portion increases proportionally to approximately 43%, 52%, and 74%, linearly. For another example, when the temperature is approximately 260° C., the lateral charge loss portion is approximately 80%. That is, when the lateral charge loss portion increases, the threshold voltage distribution of memory cells may be affected.

Figure 6:
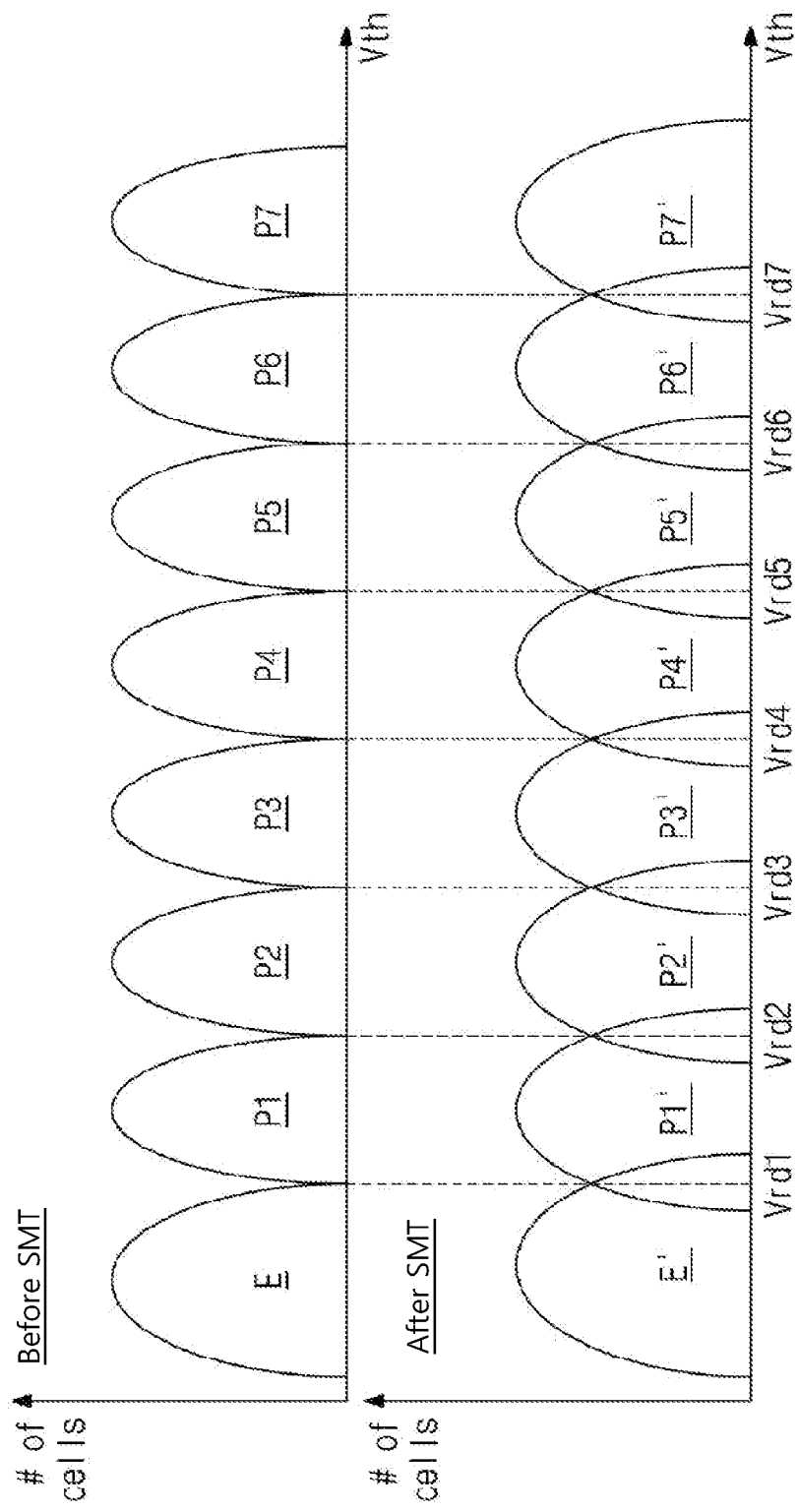
FIG. 6 is a graph illustrating distribution of threshold voltages of the memory cells of FIG. 4, according to an embodiment.

FIG. 6 is a graph illustrating distribution of threshold voltages of the memory cells of FIG. 4, according to an embodiment. In FIG. 6, the horizontal axis represents the threshold voltage Vth, and the vertical axis represents the number of memory cells. Referring to FIG. 6, in the case of a triple-level cell (TLC) memory capable of storing three (3) bits in one memory cell, one memory cell may have one of eight threshold voltage distributions. However, due to differences in electrical characteristics between the plurality of memory cells, the threshold voltage of each memory cell of the plurality of memory cells programmed with substantially the same data may form a threshold voltage distribution within a certain range.

In the case of TLC, threshold voltage distributions corresponding to one erase state E and seven program states P1 to P7 may be formed. Referring to FIG. 6, the upper threshold voltage distributions before the SMT process is performed (Before SMT), and the lower threshold voltage distributions show after the SMT process is performed (After SMT) are shown. For example, the threshold voltage distributions before the SMT process may be ideally distributed, such that the threshold voltage distributions corresponding to the respective states E, P1 to P7 may not overlap. Accordingly, the flash memory 1100 may determine the state of the memory cell using the select read voltages Vrd1 to Vrd7.

However, after the SMT process, charges trapped in the memory cells may be released in a lateral direction due to high-temperature degradation. At this time, the threshold voltage distributions may be moved to the left or right. For example, in the case of the SMT process, memory cells may experience a high-temperature environment of about 260° C. and, as a result, the threshold voltage distributions corresponding to the erase state E' and seven program states P1' to P7' may overlap each other. That is, the SMT process may redistribute the threshold voltages such that the threshold voltages are no longer ideally distributed and overlap each other.

Consequently, if the threshold voltage distributions overlap, error bits of a certain level or higher may occur when the read voltage is applied. For example, when the first read voltage Vrd1 is applied, on memory cells may be assumed to be in the left erase state (e.g., E'), and off memory cells may be assumed to be in the right first program state (e.g., P1'). That is, when threshold voltage distributions overlap, a specific memory cell may be read as an off memory cell (e.g., in state P1') even though the specific memory cell may be an on memory cell (e.g., in erased state E'). Furthermore, as the temperature of the flash memory 1100 increases, the probability of occurrence of error bits may increase.

Figure 7:
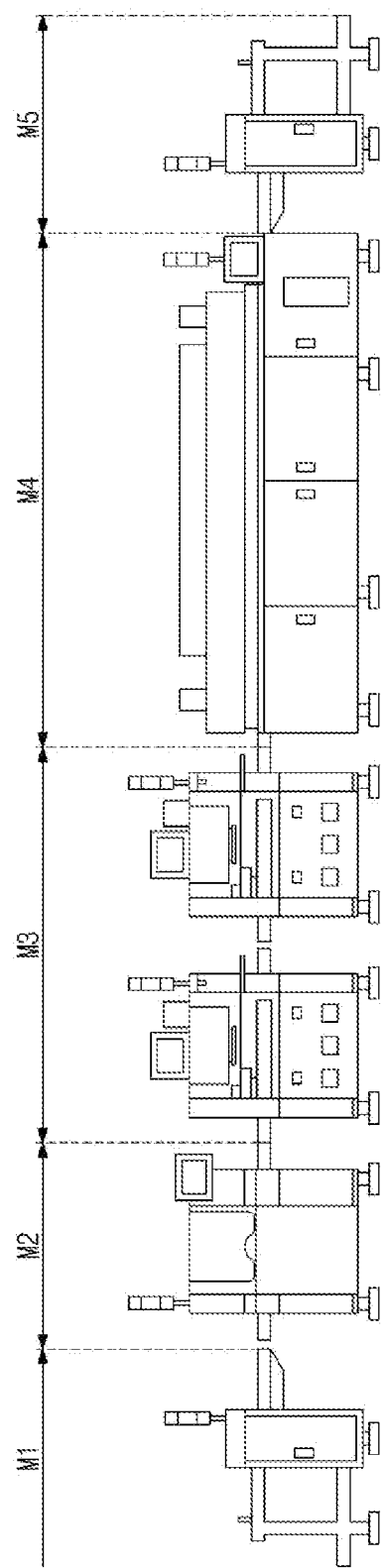
FIG. 7 is a conceptual diagram illustrating an example of a surface mount technology (SMT) process, according to an embodiment.

FIG. 7 is a conceptual diagram illustrating an example of an SMT process, according to an embodiment. Referring to FIG. 7, the SMT process may include a loading step M1, a printing step M2, a mounting step M3, a bonding step M4, and an unloading step M5.

In the SMT process, solder paste may be printed on a printed circuit board (PCB). Various surface mount devices (SMD) may be mounted on the PCB using mounter equipment, and then the PCB may be passed through a reflow oven. Alternatively or additionally, leads of the PCB and leads of the SMD may be bonded. The SMT process may refer to a technology that produces a finished PCB by an organic combination of a plurality of equipment. Depending on the working environment, at least one SMT process line including a plurality of equipment may be provided.

The loading step M1 may include loading the PCB into the SMT equipment area. For example, a loader may be a device that automatically supplies PCB. The loader may supply PCB using a medium called a magazine.

The printing step M2 may include applying a solder to a pattern region of PCB on which a plurality of devices are to be mounted. For example, a print inspector may apply the solder to a component mounting location on the surface of PCB loaded through the loader.

The mounting step M3 may include mounting a plurality of devices on the solder. For example, a chip mounter may place and fix various components and chips on a land portion on PCB where the solder is applied. For example, a plurality of chip mounters may be formed.

The bonding step M4 may include reflowing the solder. For example, a reflow oven may heat and melt solder paste underneath components mounted on a PCB, and then fix the components onto the PCB through a curing process. For example, the reflow oven may heat the solder at a high temperature of 260 degrees for 30 seconds.

The unloading step M5 may include unloading the PCB to which a plurality of devices are bonded to the outside of the SMT equipment area. For example, the unloader may move the PCB out of the SMT process line. For example, the unloader may include an inspection device that compares the image of the cured PCB with the stored reference image to determine whether the finished PCB is good or bad.

The flash memory 1100 may be degraded to a high temperature by being exposed to a high-temperature environment in the bonding step M4. The threshold voltage of flash memory cells may change while passing through the SMT process line. As a result, the probability of occurrence of error bits in data stored in the flash memory 1100 may increase due to the SMT process. The memory system 1100 according to an embodiment of the present disclosure may reduce error bits of the flash memory 1100 and increase data reliability even when an SMT process is performed.

Figure 8:
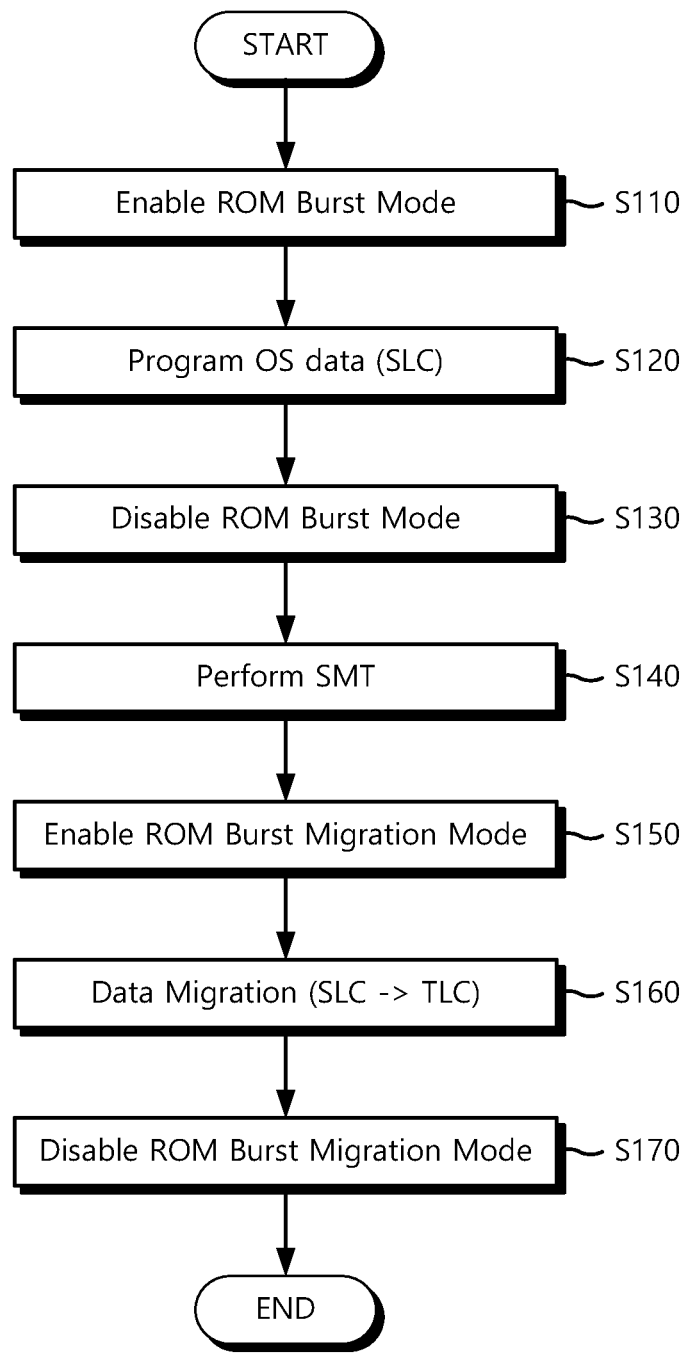
FIG. 8 is a flowchart illustrating an example of a general SMT operation method, according to an embodiment.

FIG. 8 is a flowchart illustrating an example of a general SMT operation method, according to an embodiment. For example, referring to FIG. 8, a ROM burst mode may be performed before the SMT process is performed, and/or a ROM burst migration mode may be performed after the SMT process has been performed.

In operation S110, the ROM burst mode may be enabled. The ROM burst mode may be enabled through a command provided from the host (e.g., host 1500 of FIG. 1). A set feature for activating the ROM burst mode may be set in the ROM (e.g., ROM 1230 of FIG. 1) of the memory controller (e.g., memory controller 1200 of FIG. 1).

The ROM burst mode may refer to a program mode for storing OS data before a flash memory (e.g., flash memory 1100 FIG. 1) performs an SMT process. After the ROM burst mode is enabled, the memory controller 1200 may single level cell (SLC) program OS data into the flash memory 1100 (operation S120). After programming the OS data, the memory controller 1200 may disable the ROM burst mode (operation S130).

After the ROM burst mode is completed, the SMT process described above with reference FIG. 7 may be performed (operation S140). Since the threshold voltage of the flash memory cells may change while passing through the SMT process line, the probability of generating error bits may increase.

The memory controller 1200 may enable the ROM burst migration mode after the SMT process (operation S150). The ROM burst migration mode may refer to a program mode for restoring OS data to its original state after the flash memory 1100 performs an SMT process.

After the ROM burst migration mode is enabled, the memory controller 1200 may perform a data migration operation (operation S160). For example, the flash memory 1100 may perform data migration of the SLC programmed OS data to TLC programmed OS data. After performing the data migration operation, the memory controller 1200 may disable the ROM burst migration mode (operation S170).

Figure 9:
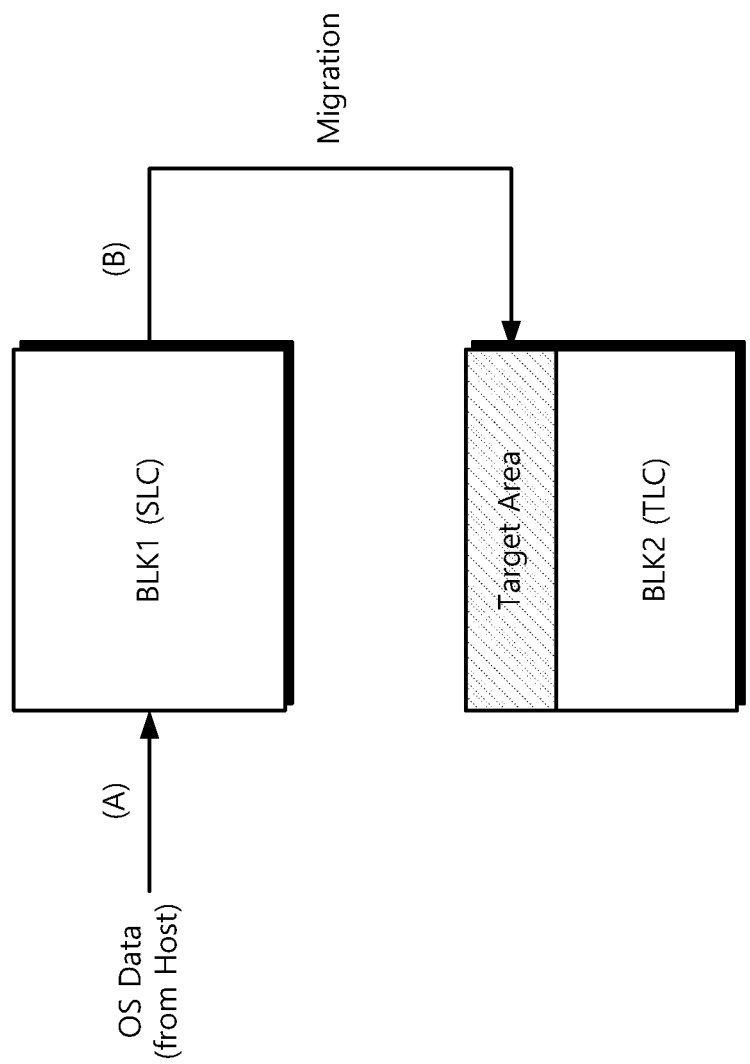
FIG. 9 is a conceptual diagram illustrating an example of the data migration operation of FIG. 8, according to an embodiment.

FIG. 9 is a conceptual diagram illustrating an example of the data migration operation of FIG. 8, according to an embodiment. Referring to FIG. 9, when OS data is provided from the host 1500, the OS data may be SLC programmed into the first memory block BLK1 under the control of the memory controller 1200 (e.g., (A) of FIG. 9). The OS data stored in the first memory block BLK1 may move to a target area of the second memory block BLK2 after the SMT process (e.g., (B) of FIG. 9).

According to various embodiments, the process of assembling the memory system 100, including the flash memory 1100, may include performing an SLC program before the SMT process, and an operation of migrating from SLC to TLC may be performed after the SMT process. Alternatively, if the TLC program is performed before the SMT process, rather than the SLC program, the probability of generating error bits may increase due to high-temperature deterioration of the SMT process. That is, to reduce (and/or minimize) the probability of generating error bits due to high-temperature deterioration of the SMT process, the OS data programmed into the flash memory 1100, before the SMT process is performed, may be programed using the SLC program.

However, if the OS data is SLC programmed before the SMT process, only about 25% of the total write capacity of the flash memory 1100 may be used when compared to the TLC program. To maximize the write capacity of the flash memory 1100, it may be necessary to perform a multi-bit program (e.g., TLC program) even before the SMT process. However, if the TLC program is performed before the SMT process, as described above, the probability of generating error bits due to high-temperature degradation of the SMT process may increase.

The SMT operation method, according to an embodiment of the present disclosure, may perform multi-bit programming of OS data prior to the SMT process. For example, embodiments of the present disclosure may increase the write capacity of the flash memory 1100 by performing a TLC program on OS data before performing the SMT process. In addition, embodiments of the present disclosure may reduce the probability of generating error bits due to high-temperature deterioration in the SMT process.

Figure 10:
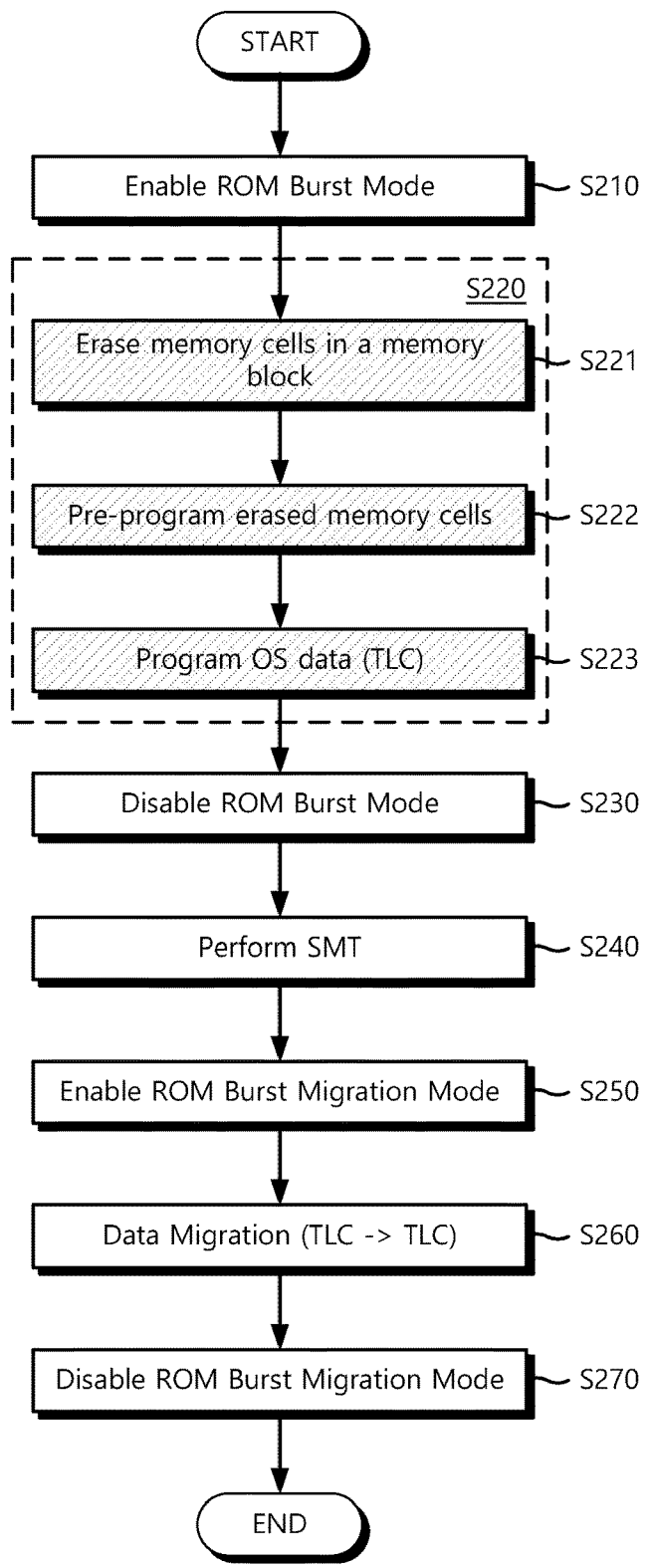
FIG. 10 is a flowchart illustrating an SMT operation method, according to an embodiment.

FIG. 10 is a flowchart illustrating an SMT operation method, according to an embodiment. FIG. 11 is a graph illustrating distribution of threshold voltages of memory cells, according to an embodiment.

The SMT operation method shown in FIG. 10 increases threshold voltages of memory cells in an erased state by performing a pre-program operation before programming the OS data. When threshold voltages of memory cells in an erased state increase, lateral charge loss of adjacent memory cells may be reduced during an SMT process. Consequently, the present disclosure may reduce the error bit probability due to the SMT process by reducing the lateral charge loss of adjacent memory cells.

The memory controller 1200 may enable the ROM burst mode (operation S210). After the ROM burst mode is enabled, a soft stress mode may be performed (operation S220). The OS data may be TLC programmed into the flash memory 1100 during soft stress mode. As shown in FIG. 10, operation S220 may include operations S221 through S223.

In operation S221, the memory controller 1200 may erase memory cells of the flash memory 1100. Referring to FIG. 11, memory cells of the flash memory 1100 may have threshold voltages lower than the erase verify voltage Vefy through an erase operation. All memory cells in a memory block may be in an erased state E0.

In operation S222, the memory controller 1200 may pre-program the erased memory cells. The pre-program operation may be performed through at least one of several ways. For example, the pre-program operation may be performed by providing a pre-program voltage to some or all of the word lines connected to the memory block. At this time, the pre-program voltage may be applied once or more at a predetermined level.

Alternatively or additionally, the pre-program operation may be performed by providing an incremental step pulse voltage (ISPP) for each word line. Referring to FIG. 11, memory cells of the flash memory 1100 may have a first erase state E1 higher than the pre-program verify voltage Vpfy through a pre-program operation. For another example, the pre-program operation may be performed without performing the pre-program verify operation while applying the incremental step pulse voltage.

In operation S223, the memory controller 1200 performs pre-programming and then may TLC program the OS data into the flash memory 1100. When the threshold voltages of the memory cells increase from the erased state E0 to the first erased state E1, lateral charge loss of adjacent memory cells may be reduced during the SMT process.

After programming the OS data, the memory controller 1200 may disable the ROM burst mode (operation S230). After the ROM burst mode completed, an SMT process may be performed (operation S240). Since threshold voltages of the flash memory cells may change while passing through the SMT process line, the probability of generating error bits may increase.

The memory controller 1200 may enable the ROM burst migration mode after the SMT process (operation S250). The ROM burst migration mode may refer to a program mode for restoring OS data to its original state after the flash memory 1100 performs an SMT process.

After the ROM burst migration mode is enabled, the memory controller 1200 may perform a data migration operation (operation S260). The migration operation may refer to an operation of converting a first threshold voltage distribution changed due to the SMT process into a second threshold voltage distribution. For example, the flash memory 1100 may restore the threshold voltage distribution changed due to the soft stress mode (operation S220) to an original state through a data migration operation. After performing the data migration operation, the memory controller 1200 may disable the ROM burst migration mode (operation S270).

The SMT operating method, according to an embodiment of the present disclosure, may perform multi-bit programming of OS data before performing the SMT process. For example, the SMT operating method may perform a TLC program of OS data before performing the SMT process and may reduce the error bit occurrence probability due to high-temperature deterioration of the SMT process.

During the ROM burst mode operation performed before the SMT process, the threshold voltage of memory cells in an erased state may be increased by using a soft program or read disturbance. When the threshold voltages of memory cells in an erase state increase, lateral charge loss of adjacent memory cells may decrease. Thus, according to the SMT process, the error bit probability may be reduced by reducing the lateral charge loss of adjacent memory cells.

Figure 12:
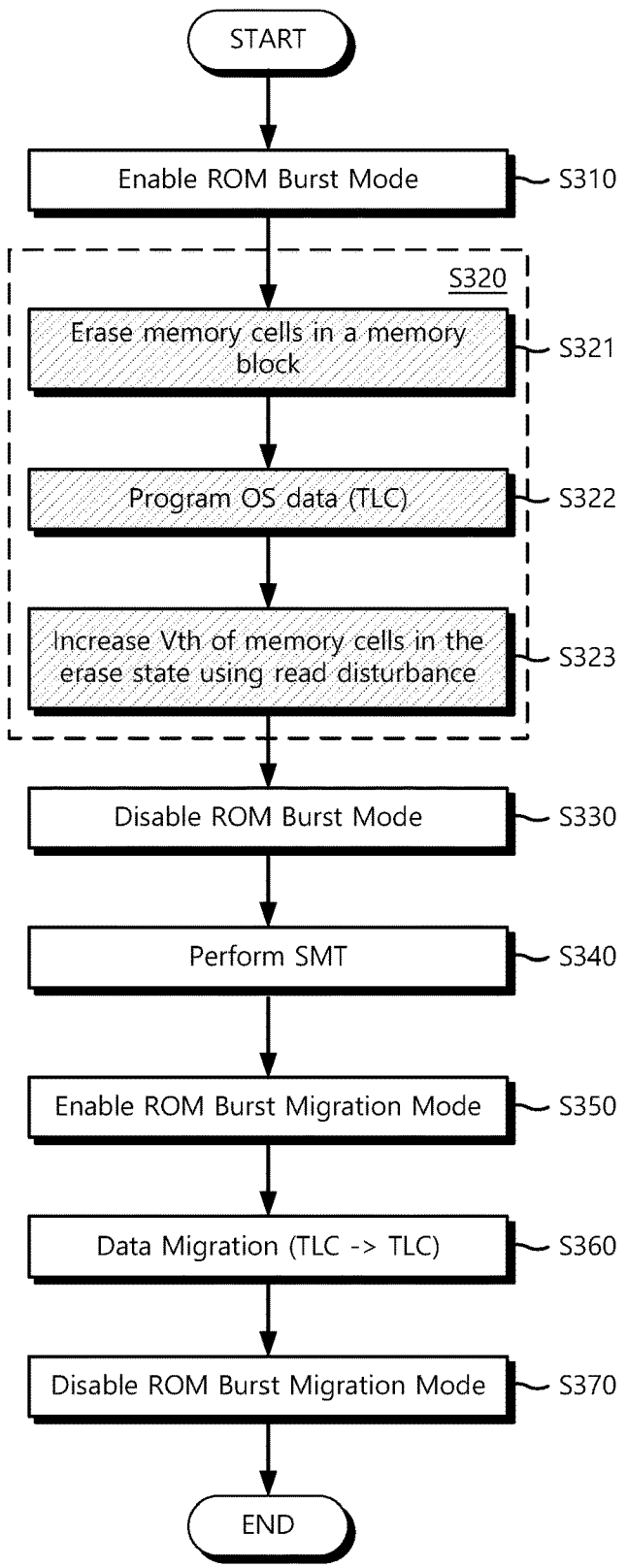
FIG. 12 is a flowchart illustrating an SMT operating method, according to an embodiment.
Figure 13:
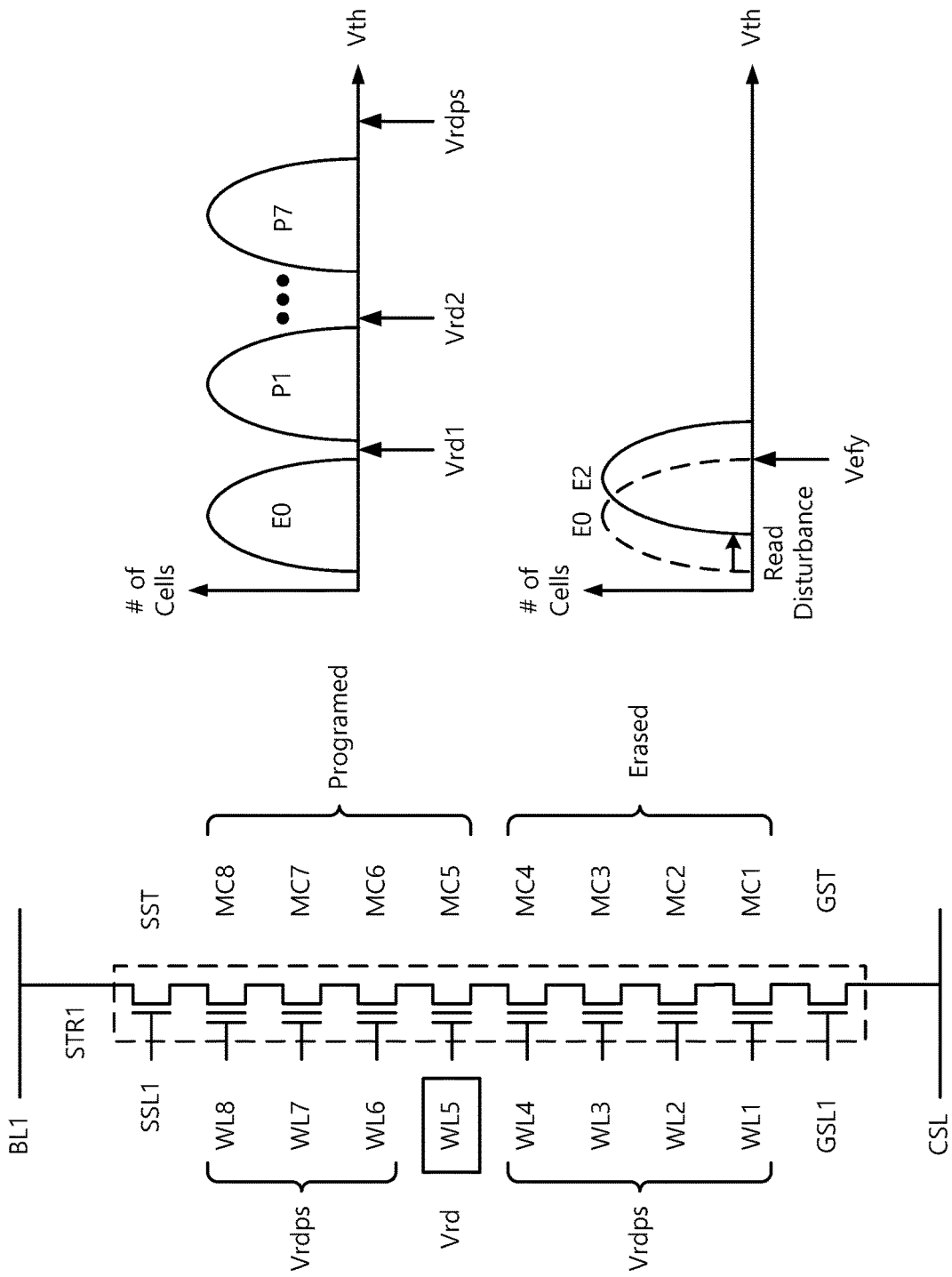
FIG. 13 is a graph illustrating threshold voltage distributions of memory cells, according to an embodiment.

FIG. 12 is a flowchart illustrating an SMT operating method, according to an embodiment. FIG. 13 is a graph illustrating threshold voltage distributions of memory cells, according to an embodiment.

The SMT operation method illustrated in FIG. 12 performs a soft stress mode before the SMT process. During the soft stress mode, OS data may be TLC programmed. Consequently, threshold voltages of memory cells in an erased state that have not yet been programmed may be increased by read disturbance. When threshold voltages of memory cells in an erased state increase, lateral charge loss of adjacent memory cells may be reduced during an SMT process. Thus, the error bit probability may be reduced by reducing the lateral charge loss of adjacent memory cells.

Referring to FIG. 12, the memory controller 1200 may enable the ROM burst mode (operation S310). After the ROM burst mode is enabled, a soft stress mode may be performed (operation S320). The OS data may be TLC programmed during soft stress mode. As shown in FIG. 12, operation S320 may include operations S321 through S323.

In operation S321, the flash memory 1100 may erase memory cells. Memory cells of the flash memory 1100 may have a threshold voltage lower than the erase verify voltage Vefy through an erase operation. All memory cells in a memory block may be in an erased state E0.

In operation S322, the flash memory 1100 may perform TLC programming of OS data. The flash memory 1100 may perform programming in a top to bottom (T2B) method. That is, the flash memory 1100 may be programmed in a direction from SST to GST. Referring to FIG. 13, the first to fourth memory cells MC1 to MC4 may be in an erased state, and the fifth to eighth memory cells MC5 to MC8 may be in a programmed state. In addition to the T2B method, the flash memory 1100 may perform programming using a bottom to top (B2T) method or other various methods. That is, the present disclosure is not limited in this regard.

Each of the programmed memory cells may have one of the erase state E0 and the first to seventh program states P1 to P7. The flash memory 1100 may read OS data stored in memory cells using the select read voltages (e.g., Vrd1, Vrd2, etc.).

In operation S323, the flash memory 1100 may perform a read operation by providing a select read voltage Vrd to a selected word line (e.g., WL5) and a read pass voltage Vrdps to unselected word lines (e.g., WL1-WL4, WL6-WL8). The read operation of the flash memory 1100 may be repeatedly performed several times. As the read operation is repeated, the memory cells MC1 to MC4 in the erased state may experience read disturbance due to the high read pass voltage Vrdps. Due to the read disturbance, threshold voltages of the memory cells MC1 to MC4 in an erase state may increase.

Referring to FIG. 13, memory cells MC1 to MC4 in an erased state of the flash memory 1100 may have a second erased state E2 higher than the original erased state E0 due to read disturbance. When the threshold voltage of the memory cells MC1 to MC4 in the erased state may increase from the erased state E0 to the second erased state E2, lateral charge loss of adjacent memory cells may be reduced during the SMT process.

After the soft stress mode (operation S320) is completed, the memory controller 1200 may disable the ROM burst mode (operation S330). After the ROM burst mode is completed, an SMT process may be performed (operation S340). Since the threshold voltage of the flash memory cells may change while passing through the SMT process line, the probability of generating error bits may increase.

The memory controller 1200 may enable the ROM burst migration mode after the SMT process (operation S330). The ROM burst migration mode may refer to a program mode for restoring OS data to its original state after the flash memory 1100 performs an SMT process.

After the ROM burst migration mode is enabled, the memory controller 1200 may perform a data migration operation (operation S360). The migration operation may refer to an operation of converting a first threshold voltage distribution changed due to the SMT process into a second threshold voltage distribution. For example, the flash memory 1100 may restore the threshold voltage distribution changed due to the soft stress mode (operation S320) to an original state through a data migration operation. After performing the data migration operation, the memory controller 1200 may disable the ROM burst migration mode (operation S370).

The SMT operating method, according to an embodiment of the present disclosure, may perform multi-level cell programming of OS data before the SMT process. For example, the SMT operating method may perform a TLC program on OS data before the SMT process and may reduce the error bit occurrence probability due to high-temperature deterioration of the SMT process.

During the ROM burst mode operation before the SMT process, the threshold voltage of memory cells in an erased state may be increased by using a soft program or read disturbance. When threshold voltages of memory cells in an erase state increase, lateral charge loss of adjacent memory cells may decrease. The SMT operating method may reduce the error bit probability by reducing the lateral charge loss of adjacent memory cells.

Figure 14:
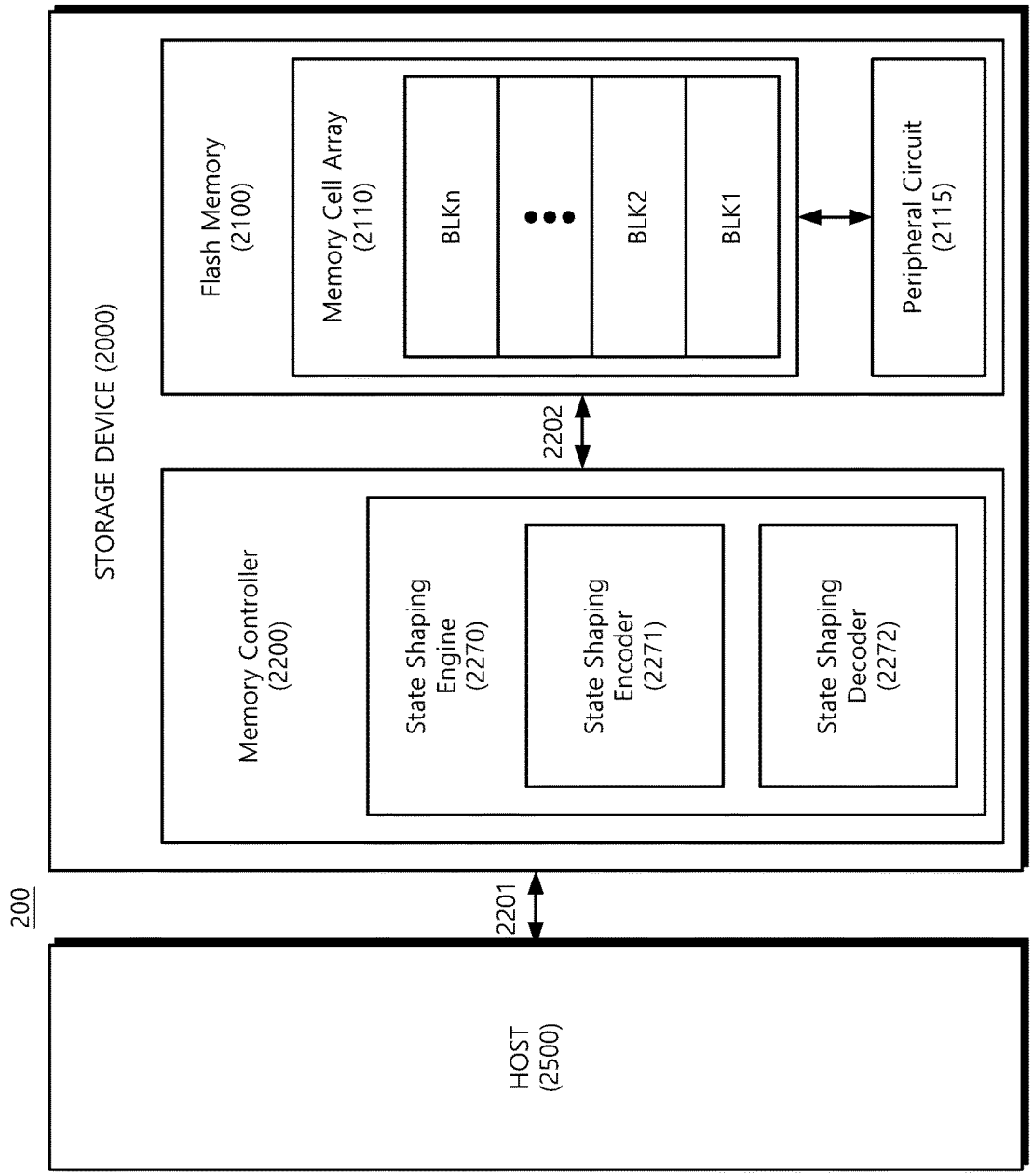
FIG. 14 is a block diagram illustrating a memory system, according to an embodiment.

FIG. 14 is a block diagram illustrating a memory system according to an embodiment of the present disclosure. Referring to FIG. 14, a memory system 200 includes a storage device 2000 and a host 2500. The storage device 2000 may be connected to the host 2500 through a host interface 2201.

The storage device 2000 may be based on non-volatile memory. For example, the storage device 2000 may include a flash storage device based on the flash memory 2100. The storage device 2000 may include a flash memory 2100 and a memory controller 2200.

The flash memory 1100 may be connected to the memory controller 2200 through a flash interface 2202. The flash memory 2100 may include a memory cell array 2110 and a peripheral circuit 2115. The memory cell array 2110 may include a plurality of memory blocks BLK.

The memory controller 2200 may include a state shaping engine 2270 configured to perform state shaping of data. The state shaping engine 2270 may include a state shaping encoder 2271 and a state shaping decoder 2272.

The state shaping encoder 2271 may encode original data to avoid a data pattern that deteriorates reliability of the flash memory 2100. For example, when a program operation is performed on the flash memory 2100 without state shaping encoding, the reliability of the flash memory 2100 may deteriorate due to F-poly coupling between memory cells included in the flash memory 2100. That is, F-poly coupling may result in widening of threshold voltage distributions. Encoded data may be provided to the flash memory 2100.

In an embodiment, the state shaping encoder 2271 may TLC program the OS data before the SMT process and then encode the original data. That is, the state shaping encoder 2271 may reduce the ratio of memory cells in an erased state by encoding OS data. The flash memory 2100 may reduce lateral charge loss of adjacent memory cells by reducing the ratio of memory cells in an erased state before the SMT process. Consequently, the memory system 200 shown in FIG. 14 may reduce the error bit probability due to the SMT process by reducing the lateral charge loss of adjacent memory cells when compared to related memory systems.

Alternatively or additionally, the state shaping encoder 2271 may be configured to adjust a ratio of memory cells in a program state in addition to an erase state. As a result, the lateral charge loss due to the SMT process may be reduced. The state shaping decoder 2272 may receive encoded data from the flash memory 2100 after the SMT process and restore original data.

Figure 15:
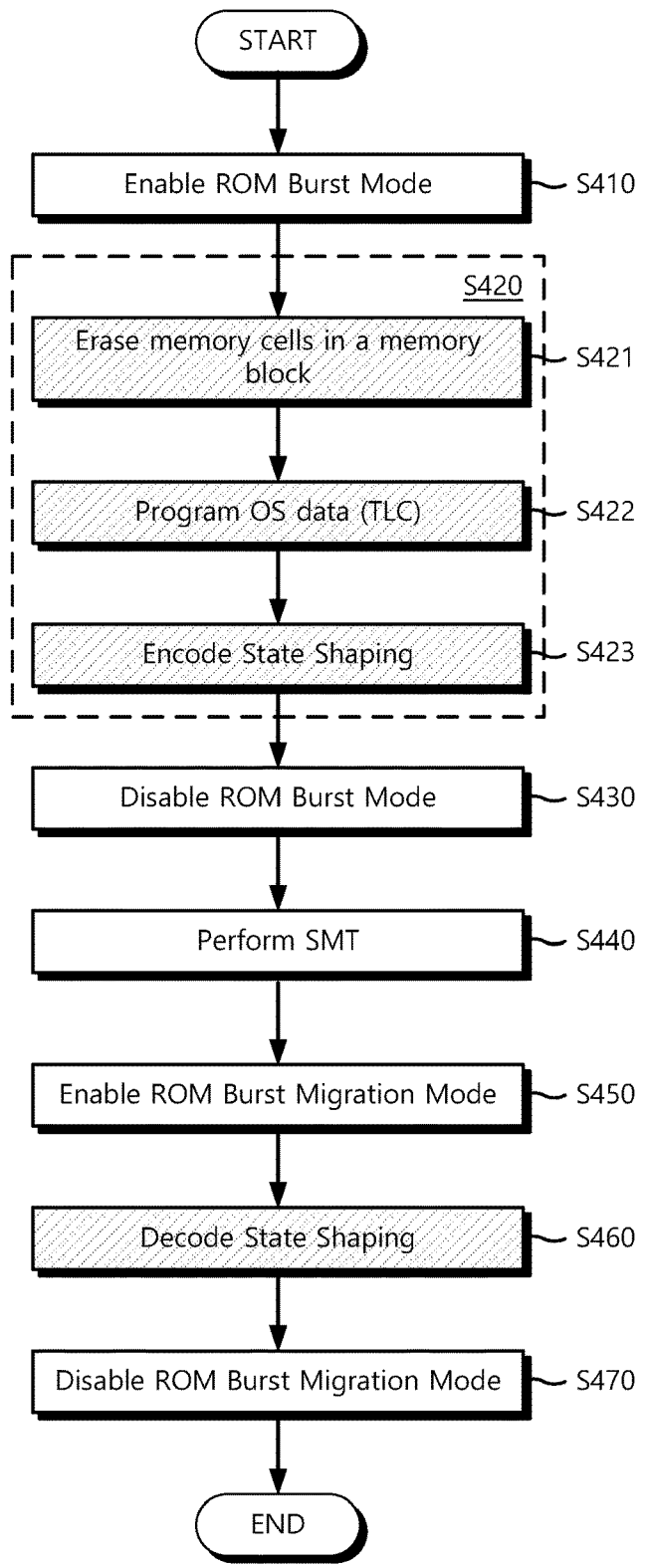
FIG. 15 is a flowchart illustrating an SMT operation method of the memory system of FIG. 14, according to an embodiment.
Figure 16:
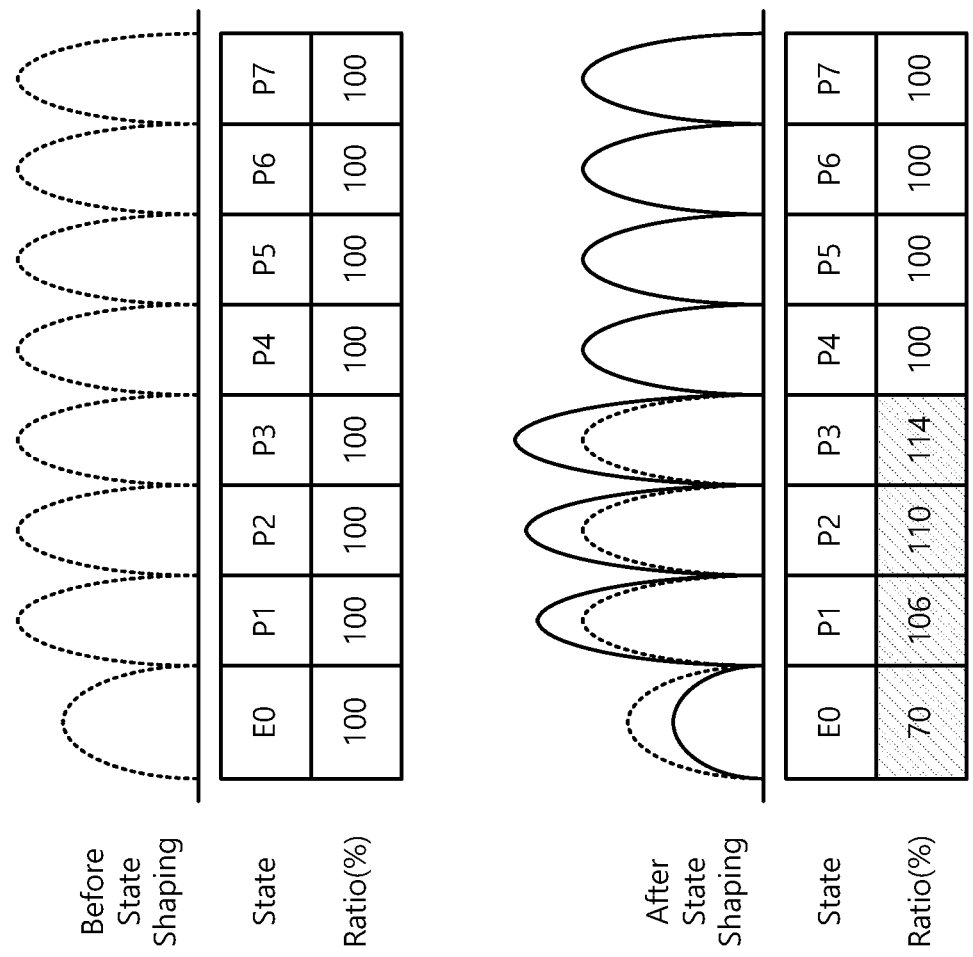
FIG. 16 is a diagram for explaining a state shaping method of memory cells, according to an embodiment.

FIG. 15 is a flowchart illustrating an SMT operation method of the memory system of FIG. 14, according to an embodiment. FIG. 16 is a diagram for explaining a state shaping method of memory cells, according to an embodiment.

The SMT operation method illustrated in FIG. 15 performs a state shaping mode before the SMT process. During the state shaping mode, OS data is TLC programmed, and the number of memory cells in an erased state may be reduced using state shaping. When the number of memory cells in the erased state is reduced, lateral charge loss of adjacent memory cells may be reduced during the SMT process. Consequently, the SMT operation method of FIG. 15 may reduce the error bit probability due to the SMT process by reducing the lateral charge loss of adjacent memory cells.

Referring to FIG. 15, the memory controller 2200 may enable the ROM burst mode (operation S410). After the ROM burst mode is enabled, a state shaping mode may be performed (operation S420). OS data may be TLC programmed during state shaping mode. As shown in FIG. 15, operation S420 includes operations S421 through S423.

In operation S421, the flash memory 2100 may erase memory cells. Memory cells of the flash memory 2100 may have threshold voltages lower than the erase verify voltage through an erase operation. All memory cells in a memory block may be in an erased state E0.

In operation S422, the flash memory 2100 may perform TLC programming of OS data. Each of the programmed memory cells may have one of the erase state E0 and the first to seventh program states P1 to P7.

In operation S423, the flash memory 2100 may perform a state shaping operation using the state shaping encoder 2271. For example, the state shaping operation may be an operation for reducing lateral charge loss of adjacent memory cells during an SMT process by reducing the number of memory cells in an erased state.

Referring to FIG. 16, it may be assumed that OS data is evenly distributed in an erase state E0 and first to seventh program states P1 to P7 at a ratio of 100% in the flash memory 2100 before a state shaping operation. That is, memory cells of the flash memory 2100 may be equally distributed in each state.

When the state shaping operation is performed, the erased state E0 may be reduced to 70% of the original memory cells, for example. For another example, the first program state P1 may increase to 106%, the second program state P2 may increase to 110%, and the third program state P3 may increase to 114%. Alternatively or additionally, the fourth to seventh program states P4 to P7 may be maintained at 100%. When the number of memory cells in an erased state is reduced through the state shaping operation, lateral charge loss of adjacent memory cells may also be reduced during the SMT process.

After the state shaping mode (operation S420) is completed, the memory controller 2200 may disable the ROM burst mode (operation S430). After the ROM burst mode is completed, an SMT process may be performed (operation S440). Since the threshold voltage of the flash memory 2100 may change while passing through the SMT process line, the probability of generating error bits may increase.

The memory controller 2200 may enable the ROM burst migration mode after the SMT process (operation S430). The ROM burst migration mode may refer a program mode for restoring OS data to its original state after the flash memory 2100 performs an SMT process.

After the ROM burst migration mode is enabled, the memory controller 2200 may perform a data migration operation using the state shaping decoder 2272 (operation S460). The flash memory 2100 may restore the threshold voltage distribution changed through the state shaping encoding operation to an original state. After performing the data migration operation, the memory controller 2200 may disable the ROM burst migration mode (operation S470).

The SMT operation method, according to an embodiment of the present disclosure, may perform a state shaping operation of OS data before the SMT process. The SMT operation method may perform a TLC program on OS data before the SMT process and reduce the probability of error bit occurrence due to high-temperature degradation of the SMT process. During the ROM burst mode operation performed before the SMT process, the number of memory cells in an erased state may be reduced by using a state shaping operation. When the number of memory cells in the erased state decreases, lateral charge loss of adjacent memory cells may decrease. Consequently, the SMT operation method may reduce the error bit probability due to the SMT process by reducing the lateral charge loss of adjacent memory cells.

Figure 17:
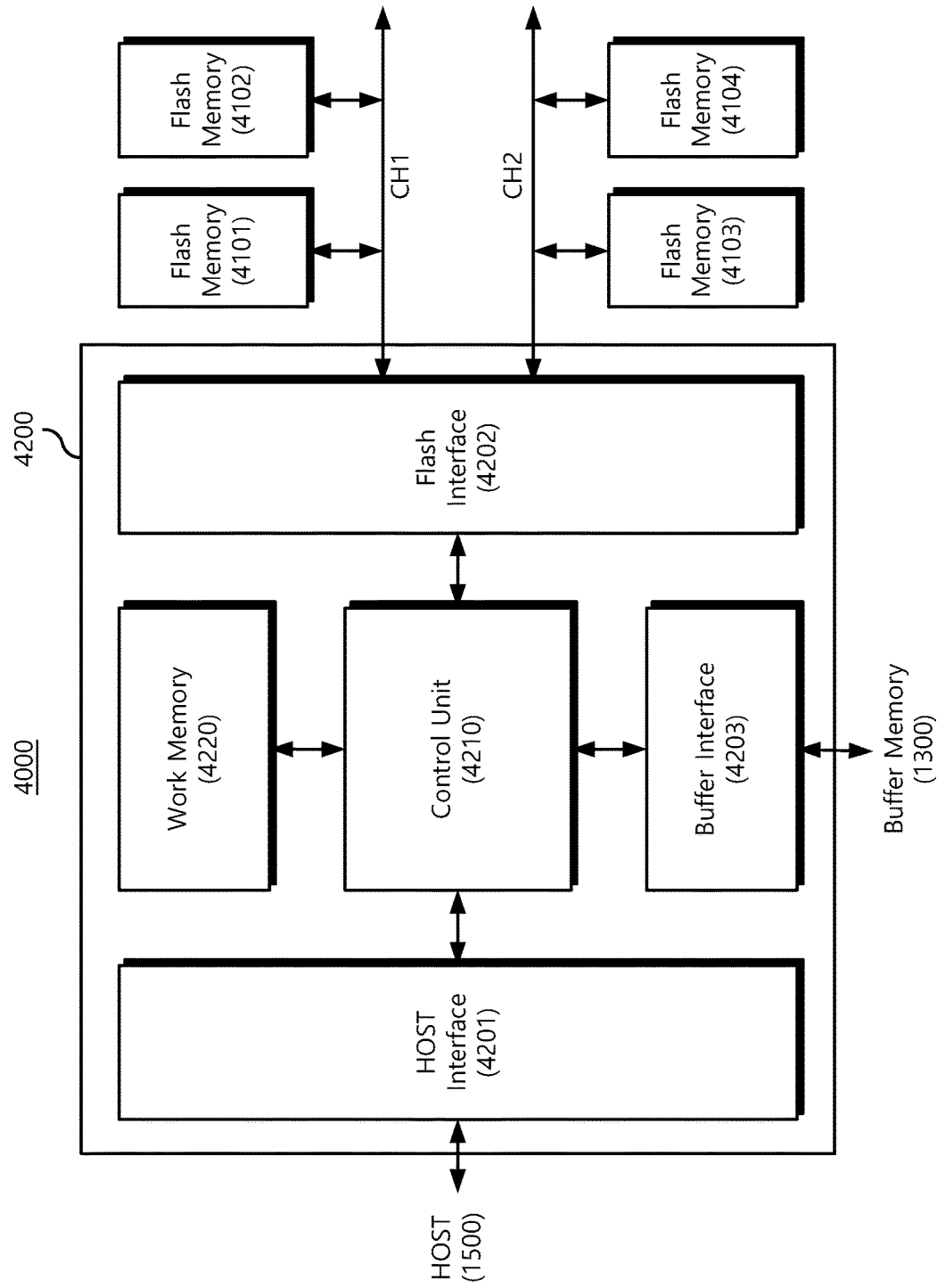
FIG. 17 is a block diagram illustrating an example in which a storage device is implemented as a solid state drive, according to an embodiment.

FIG. 17 is a block diagram illustrating an example in which a storage device according to an embodiment of the present disclosure is implemented with a SSD. Referring to FIG. 17, an SSD 4000 may include a plurality of flash memories (e.g., first flash memory 4101, second flash memory, 4102, third flash memory 4103, and fourth flash memory 4104) and an SSD controller 4200.

The first flash memory 4101 and the second flash memory 4102 may be connected with the SSD controller 4200 through a first channel CH1. The third flash memory 4103 and the fourth flash memory 4104 may be connected with the SSD controller 4200 through a second channel CH2. The number of channels connected with the SSD controller 4200 may be two (2) or more. The number of flash memories connected with one channel may be two (2) or more. That is, the number of channels and/or the number of memories is not limited by the present disclosure.

The SSD controller 4200 may include a host interface 4201, a flash interface 4202, a buffer interface 4203, a control unit 4210, and a work memory 4220. The SSD controller 4200 may be connected with a host 1500 through the host interface 4201. Depending on a request of the host 1500, the SSD controller 4200 may write data in the corresponding flash memory and/or may read data from the corresponding flash memory.

The SSD controller 4200 may be connected with the plurality of flash memories 4101 to 4104 through the flash interface 4202 and may be connected with a buffer memory 1300 through the buffer interface 4203. The flash interface 4202 may provide data, which are temporarily stored in the buffer memory 1300, to the flash memories through the channels CH1 and CH2. The flash interface 4202 may transfer the data read from the flash memories 4101 to 4104 to the buffer memory 1300.

The control unit 4210 may analyze and process the signal received from the host 1500. The control unit 4210 may control the host 1500 or the flash memories 4101 to 4104 through the host interface 4201 or the flash interface 4202. The control unit 4210 may control operations of the flash memories 4101 to 4104 by using firmware for driving the SSD 4000.

The SSD controller 4200 may manage data to be stored in the flash memories 4101 to 4104. In the sudden power-off event, the SSD controller 4200 may back the data stored in the work memory 4220 or the buffer memory 1300 up to the flash memories 4101 to 4104.

Figure 18:
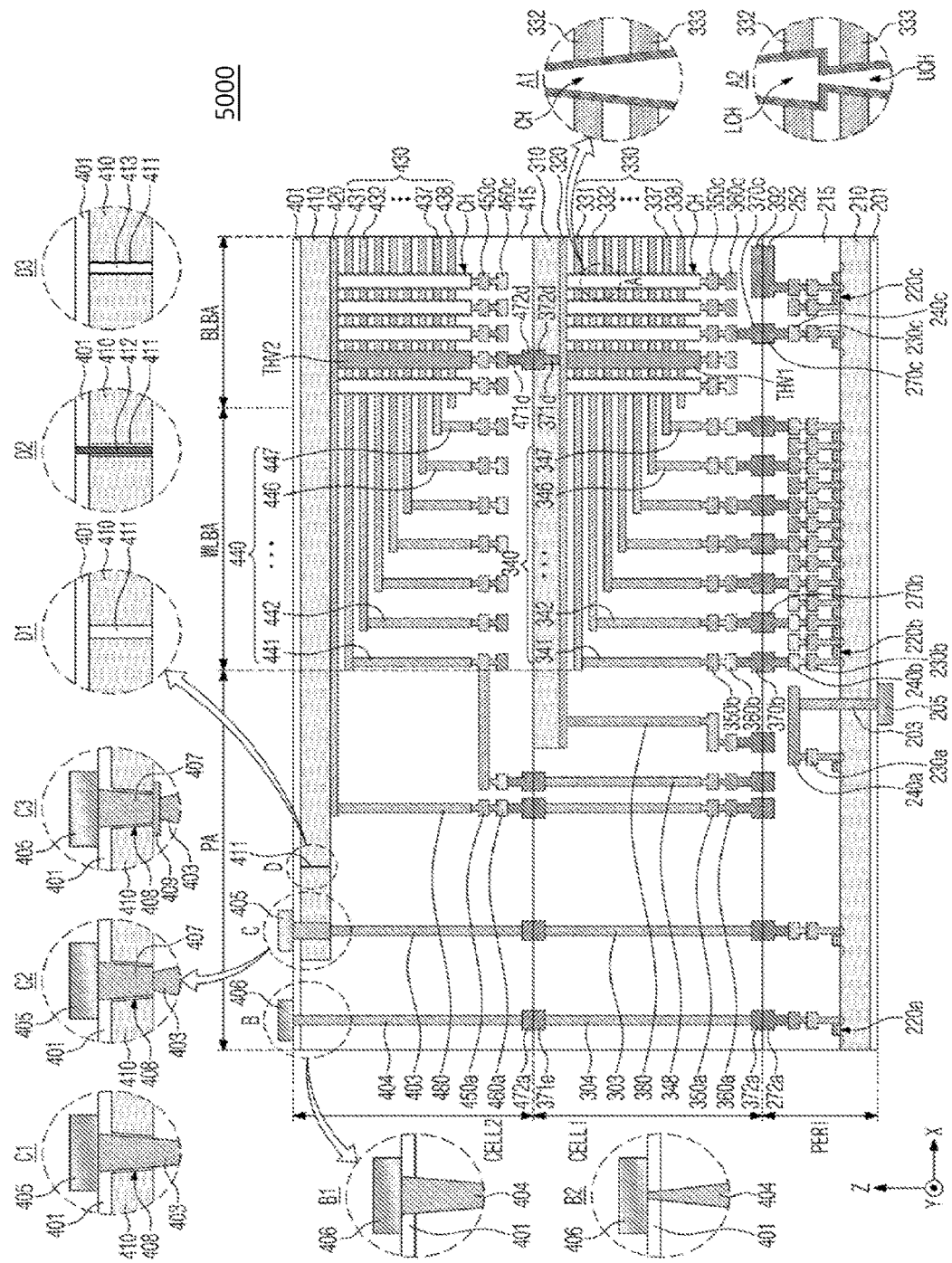
FIG. 18 is a view illustrating a memory device, according to an embodiment.

FIG. 18 is a view illustrating a memory device 5000 according to some embodiments of the present disclosure.

Referring to FIG. 18, the memory device 5000 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may refer to a method of electrically and/or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively or additionally, the bonding metal patterns may be formed of aluminum (Al) or tungsten (W).

The memory device 5000 may include the at least one upper chip including the cell region. For example, the memory device 5000 may include two upper chips. However, the number of the upper chips is not limited thereto. In the case in which the memory device 5000 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 5000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips may be defined based on orientations of the first and second upper chips before each of the first and second upper chips is turned over. That is, an upper portion of the lower chip may refer to an upper portion that may have been defined based on a +Z-axis direction, and the upper portion of each of the first and second upper chips may refer to an upper portion that may have been defined based on a —Z-axis direction. However, embodiments of the present disclosure are not limited thereto. For example, in some embodiments, one of the first upper chip and the second upper chip may be turned over and then may be connected to a corresponding chip by the bonding method.

Each of the peripheral circuit region PERI and the first and second cell regions CELL1 and CELL2 of the memory device 5000 may include an external pad bonding region PA, a word line bonding region WLBA, and a bit line bonding region BLBA.

The peripheral circuit region PERI may include a first substrate 210 and a plurality of circuit elements 220*a*, 220*b* and 220*c* formed on the first substrate 210. An interlayer insulating layer 215 including one or more insulating layers may be provided on the plurality of circuit elements 220*a*, 220*b* and 220*c*, and a plurality of metal lines electrically connected to the plurality of circuit elements 220*a*, 220*b* and 220*c* may be provided in the interlayer insulating layer 215. For example, the plurality of metal lines may include first metal lines 230*a*, 230*b* and 230*c* connected to the plurality of circuit elements 220*a*, 220*b* and 220*c*, and second metal lines 240*a*, 240*b* and 240*c* formed on the first metal lines 230*a*, 230*b* and 230*c*. The plurality of metal lines may be formed of at least one of various conductive materials. For example, the first metal lines 230*a*, 230*b* and 230*c* may be formed of tungsten having a relatively high electrical resistivity, and the second metal lines 240*a*, 240*b* and 240*c* may be formed of copper having a relatively low electrical resistivity. However, the present disclosure is not limited in this regard. That is the first and second metal lines may be formed of other materials without deviating from the scope of the disclosure.

The first metal lines 230*a*, 230*b* and 230*c* and the second metal lines 240*a*, 240*b* and 240*c* are illustrated and described in the present embodiments. However, embodiments of the present disclosure are not limited thereto. In some embodiments, at least one or more additional metal lines may further be formed on the second metal lines 240*a*, 240*b* and 240*c*. In this case, the second metal lines 240*a*, 240*b* and 240*c* may be formed of aluminum, and at least some of the additional metal lines formed on the second metal lines 240*a*, 240*b* and 240*c* may be formed of copper having an electrical resistivity lower than that of aluminum of the second metal lines 240*a*, 240*b* and 240*c*.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (e.g., 331 to 338) may be stacked on the second substrate 310 in a direction (e.g., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (e.g., 431 to 438) may be stacked on the third substrate 410 in a direction (e.g., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as shown in a region 'A1', the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350*c* and a second metal line 360*c* in the bit line bonding region BLBA. For example, the second metal line 360*c* may be a bit line and may be connected to the channel structure CH through the first metal line 350*c*. The bit line 360*c* may extend in a first direction (e.g., a Y-axis direction) parallel to the top surface of the second substrate 310.

In some embodiments, as shown in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350*c* and the second metal line 360*c*. As a length of a channel increases, due to characteristics of manufacturing processes, it may be difficult to form a channel having a substantially uniform width. The memory device 5000 according to the present embodiments may include a channel having improved width uniformity due to the lower channel LCH and the upper channel UCH which are formed by the processes performed sequentially.

In the case in which the channel structure CH includes the lower channel LCH and the upper channel UCH as shown in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively or additionally, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it may be possible to reduce an influence of a non-uniform channel width between the lower and upper channels LCH and UCH on an operation of the memory device.

The number of the lower word lines 331 and 332 penetrated by the lower channel LCH may be less than the number of the upper word lines 333 to 338 penetrated by the upper channel UCH in the region 'A2'. However, embodiments of the present disclosure are not limited thereto. In some embodiments, the number of the lower word lines penetrated by the lower channel LCH may be greater than or equal to the number of the upper word lines penetrated by the upper channel UCH. Alternatively or additionally, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. The first through-electrode THV1 may penetrate the common source line 320 and the plurality of word lines 330. In some embodiments, the first through-electrode THV1 may further penetrate the second substrate 310. The first through-electrode THV1 may include a conductive material. Alternatively or additionally, the first through-electrode THV1 may include a conductive material surrounded by an insulating material. The second through-electrode THV2 may have substantially the same shape and structure as the first through-electrode THV1.

In some embodiments, the first through-electrode THV1 and the second through-electrode THV2 may be electrically connected to each other through a first through-metal pattern 372d and a second through-metal pattern 472d. The first through-metal pattern 372d may be formed at a bottom end of the first upper chip including the first cell region CELL1, and the second through-metal pattern 472d may be formed at a top end of the second upper chip including the second cell region CELL2. The first through-electrode THV1 may be electrically connected to the first metal line 350c and the second metal line 360c. A lower via 371d may be formed between the first through-electrode THV1 and the first through-metal pattern 372d, and an upper via 471d may be formed between the second through-electrode THV2 and the second through-metal pattern 472d. The first through-metal pattern 372d and the second through-metal pattern 472d may be connected to each other by the bonding method.

In addition, in the bit line bonding region BLBA, an upper metal pattern 252 may be formed in an uppermost metal layer of the peripheral circuit region PERI, and an upper metal pattern 392 having substantially the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360c may be electrically connected to a page buffer included in the peripheral circuit region PERI. For example, some of the circuit elements 220c of the peripheral circuit region PERI may constitute the page buffer, and the bit line 360c may be electrically connected to the circuit elements 220c constituting the page buffer through an upper bonding metal pattern 370c of the first cell region CELL1 and an upper bonding metal pattern 270c of the peripheral circuit region PERI.

In the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350b and second metal lines 360b may be sequentially connected onto the cell contact plugs 340 connected to the word lines 330. In the word line bonding region WLBA, the cell contact plugs 340 may be connected to the peripheral circuit region PERI through upper bonding metal patterns 370b of the first cell region CELL1 and upper bonding metal patterns 270b of the peripheral circuit region PERI.

The cell contact plugs 340 may be electrically connected to a row decoder included in the peripheral circuit region PERI. For example, some of the circuit elements 220b of the peripheral circuit region PERI may constitute the row decoder, and the cell contact plugs 340 may be electrically connected to the circuit elements 220b constituting the row decoder through the upper bonding metal patterns 370b of the first cell region CELL1 and the upper bonding metal patterns 270b of the peripheral circuit region PERI. In some embodiments, an operating voltage of the circuit elements 220b constituting the row decoder may be different from an operating voltage of the circuit elements 220c constituting the page buffer. For example, the operating voltage of the circuit elements 220c constituting the page buffer may be greater than the operating voltage of the circuit elements 220b constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370b may be formed in the first cell region CELL1, and the upper bonding metal patterns 270b may be formed in the peripheral circuit region PERI. The upper bonding metal patterns 370b of the first cell region CELL1 and the upper bonding metal patterns 270b of the peripheral circuit region PERI may be electrically connected to each other by the bonding method. The upper bonding metal patterns 370b and the upper bonding metal patterns 270b may be formed of at least one of aluminum, copper, and tungsten.

In the external pad bonding region PA, a lower metal pattern 371e may be formed in a lower portion of the first cell region CELL1, and an upper metal pattern 472a may be formed in an upper portion of the second cell region CELL2. The lower metal pattern 371e of the first cell region CELL1 and the upper metal pattern 472a of the second cell region CELL2 may be connected to each other by the bonding method in the external pad bonding region PA. Likewise, an upper metal pattern 372a may be formed in an upper portion of the first cell region CELL1, and an upper metal pattern 272a may be formed in an upper portion of the peripheral circuit region PERI. The upper metal pattern 372a of the first cell region CELL1 and the upper metal pattern 272a of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350a and a second metal line 360a may be sequentially stacked on the common source line contact plug 380 of the first cell region CELL1, and a first metal line 450a and a second metal line 460a may be sequentially stacked on the common source line contact plug 480 of the second cell region CELL2.

Input/output pads 205, 405 and 406 may be disposed in the external pad bonding region PA. A lower insulating layer 201 may cover a bottom surface of the first substrate 210, and a first input/output pad 205 may be formed on the lower insulating layer 201. The first input/output pad 205 may be connected to at least one of a plurality of the circuit elements 220a disposed in the peripheral circuit region PERI through a first input/output contact plug 203 and may be separated from the first substrate 210 by the lower insulating layer 201. Alternatively or additionally, a side insulating layer may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220a disposed in the peripheral circuit region PERI through second input/output contact plugs 403 and 303, and the third input/output pad 406 may be connected to at least one of the plurality of circuit elements 220a disposed in the peripheral circuit region PERI through third input/output contact plugs 404 and 304.

In some embodiments, the third substrate 410 may not be disposed in a region in which the input/output contact plug is disposed. For example, as shown in a region 'B', the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. In this case, the third input/output contact plug 404 may be formed by at least one of various processes.

In some embodiments, as shown in a region 'B1', the third input/output contact plug 404 may extend in a third direction (e.g., the Z-axis direction), and a diameter of the third input/output contact plug 404 may become progressively greater toward the upper insulating layer 401. That is, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In some embodiments, as shown in a region 'B2', the third input/output contact plug 404 may extend in the third direction (e.g., the Z-axis direction), and a diameter of the third input/output contact plug 404 may become progressively less toward the upper insulating layer 401. That is, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In some embodiments, the input/output contact plug may overlap with the third substrate 410. For example, as shown in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some embodiments, as shown in a region 'C1', an opening 408 may be formed to penetrate the third substrate 410, and the second input/output contact plug 403 may be connected directly to the second input/output pad 405 through the opening 408 formed in the third substrate 410. In this case, as shown in the region 'C1', a diameter of the second input/output contact plug 403 may become progressively greater toward the second input/output pad 405. However, embodiments of the present disclosure are not limited thereto, and in some embodiments, the diameter of the second input/output contact plug 403 may become progressively less toward the second input/output pad 405.

In some embodiments, as shown in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as shown in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In some embodiments, as shown in a region 'C3', a stopper 409 may further be formed on a bottom end of the opening 408 of the third substrate 410, as compared with the embodiments of the region 'C2'. The stopper 409 may be a metal line formed in the same layer as the common source line 420. Alternatively or additionally, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less (e.g., smaller) toward the lower metal pattern 371e or may become progressively greater (e.g., larger) toward the lower metal pattern 371e.

In some embodiments, a slit 411 may be formed in the third substrate 410. For example, the slit 411 may be formed at a certain position of the external pad bonding region PA. For example, as shown in a region 'D', the slit 411 may be located between the second input/output pad 405 and the cell contact plugs 440 when viewed in a plan view. Alternatively or additionally, the second input/output pad 405 may be located between the slit 411 and the cell contact plugs 440 when viewed in a plan view.

In some embodiments, as shown in a region 'D1', the slit 411 may be formed to penetrate the third substrate 410. For example, the slit 411 may be used to prevent the third substrate 410 from being finely cracked when the opening 408 is formed. However, embodiments of the present disclosure are not limited thereto, and in some embodiments, the slit 411 may be formed to have a depth ranging from approximately 60% to approximately 70% of a thickness of the third substrate 410.

In some embodiments, as shown in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In some embodiments, as shown in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it may be possible to prevent a voltage provided through the second input/output pad 405 from affecting a metal layer disposed on the third substrate 410 in the word line bonding region WLBA.

In some embodiments, the first to third input/output pads 205, 405 and 406 may be selectively formed. For example, the memory device 5000 may be realized to include only the first input/output pad 205 disposed on the first substrate 210, to include only the second input/output pad 405 disposed on the third substrate 410, or to include only the third input/output pad 406 disposed on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

According to the present disclosure, the flash memory may reduce the probability of occurrence of bit errors due to high-temperature deterioration of the SMT process.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A method of operating a flash memory, the method comprising:
   erasing a plurality of memory cells in a memory block of the flash memory such that the plurality of memory cells have first threshold voltages associated with an erase state;
   applying a pre-program voltage to word lines coupled to the memory block, wherein applying the pre-program voltage causes the plurality of memory cells to have second threshold voltages greater than the first threshold voltages;
   performing a multi-bit programming of operating system (OS) data in the plurality of memory cells after the plurality of memory cells have the second threshold voltages; and
   exposing the flash memory to a high-temperature environment process after the multi-bit programming of the OS data.

2. The method of claim 1, wherein the performing the multi-bit programming comprises:
   performing a triple-level cell (TLC) programming that stores three bits in each memory cell of the plurality of memory cells.

3. The method of claim 1, wherein the applying the pre-program voltage comprises:
   applying the pre-program voltage to a portion of the word lines coupled to the memory block.

4. The method of claim 1, wherein the applying the pre-program voltage comprises:
   applying the pre-program voltage at a constant level to the word lines coupled to the memory block.

5. The method of claim 1, wherein the applying the pre-program voltage comprises:
   applying an incremental step pulse voltage to the word lines coupled to the memory block.

6. The method of claim 5, further comprising:
   preventing a pre-program verify operation from being performed.

7. The method of claim 1, further comprising:
   restoring the first threshold voltages of the plurality of memory cells by performing a data migration operation based on determining that exposure of the flash memory to the high-temperature environment process has been completed.

8. The method of claim 1, further comprising:
   reducing, during exposure of the flash memory to the high-temperature environment process, a lateral charge loss of the plurality of memory cells due to high temperature degradation.

9. A method of operating a flash memory for programming operating system (OS) data before exposing the flash memory to a high-temperature environment process, the method comprising:
   erasing a plurality of memory cells in a memory block of the flash memory such that the plurality of memory cells have first threshold voltages associated with an erase state of a soft stress mode;

increasing the first threshold voltages of the plurality of memory cells in the erase state to second threshold voltages greater than the first threshold voltages during the soft stress mode; and multi-bit programming OS data in the plurality of memory cells during the soft stress mode.

10. The method of claim 9, wherein the soft stress mode comprises a read disturbance.

11. The method of claim 10, wherein the multi-bit programming the OS data comprises:

applying a select read voltage to a selected word line from among a plurality of word lines coupled to the memory block; and applying a read pass voltage to remaining unselected word lines from among the plurality of word lines coupled to the memory block.

12. The method of claim 11, wherein:

the applying the select read voltage comprises repeatedly applying the select read voltage to the selected word line for a plurality of times, and the applying the read pass voltage comprises repeatedly applying the read pass voltage to the remaining unselected word lines for the plurality of times.

13. The method of claim 9, further comprising:

restoring the first threshold voltages of the plurality of memory cells by performing a data migration operation based on determining that exposure of the flash memory to the high-temperature environment process has been completed.

14. The method of claim 9, wherein the multi-bit programming the OS data comprises:

performing a triple-level cell (TLC) programming that stores three bits in each memory cell of the plurality of memory cells.

15. The method of claim 9, further comprising:

reducing, during exposure of the flash memory to the high-temperature environment process, a lateral charge loss of the plurality of memory cells due to high temperature degradation.

16. A method of operating a storage device for programming operating system (OS) data in a flash memory before exposing the flash memory to a high-temperature environment process, the method comprising:

erasing memory cells in a memory block of the storage device;

performing a multi-bit programming of operating system (OS) data in the erased memory cells;

shaping, using a state shaping encoder configured to encode the OS data, program states of the multi-bit programmed memory cells; and exposing the flash memory to the high-temperature environment process after shaping the program states of the multi-bit programmed memory cells.

17. The method of claim 16, further comprising:

restoring, using a state shaping decoder, original program states of the multi-bit programmed memory cells based on determining that exposure of the flash memory to the high-temperature environment process has been completed.

18. The method of claim 16, wherein the shaping the program states of the multi-bit programmed memory cells comprises:

reducing a number of memory cells in an erased state.

19. The method of claim 16, wherein the multi-bit programming the OS data comprises:

performing a triple-level cell (TLC) programming that stores three bits in each of the erased memory cells.

20. The method of claim 16, further comprising:

reducing, during exposure of the flash memory to the high-temperature environment process, a lateral charge loss of the memory cells due to high temperature degradation.

* * * * *